United States Patent [19]
Dye

[11] Patent Number: 6,145,069
[45] Date of Patent: Nov. 7, 2000

[54] PARALLEL DECOMPRESSION AND COMPRESSION SYSTEM AND METHOD FOR IMPROVING STORAGE DENSITY AND ACCESS SPEED FOR NON-VOLATILE MEMORY AND EMBEDDED MEMORY DEVICES

[75] Inventor: Thomas A. Dye, Austin, Tex.

[73] Assignee: Interactive Silicon, Inc., Austin, Tex.

[21] Appl. No.: 09/299,966

[22] Filed: Apr. 26, 1999

Related U.S. Application Data

[63] Continuation-in-part of application No. 09/239,659, Jan. 29, 1999.

[51] Int. Cl.[7] .................................................. G06F 12/00
[52] U.S. Cl. .............................. 711/170; 711/103; 710/68; 382/233; 345/521; 345/501
[58] Field of Search ..................................... 711/103, 170; 710/68; 714/763, 764; 709/247; 382/232, 233; 345/521, 501, 507, 509

[56] References Cited

U.S. PATENT DOCUMENTS

| | | | |
|---|---|---|---|
| 4,008,460 | 2/1977 | Bryant et al. ............................ | 395/463 |
| 4,688,108 | 8/1987 | Cotton et al. ........................ | 358/261.1 |
| 4,876,541 | 10/1989 | Storer . | |
| 4,881,075 | 11/1989 | Weng ....................................... | 341/87 |
| 5,003,307 | 3/1991 | Whiting et al. . | |
| 5,016,009 | 5/1991 | Whiting et al. . | |
| 5,126,739 | 6/1992 | Whiting et al. . | |
| 5,146,221 | 9/1992 | Whiting et al. . | |
| 5,155,484 | 10/1992 | Chambers, IV . | |
| 5,237,460 | 8/1993 | Miller et al. ............................ | 395/888 |
| 5,237,675 | 8/1993 | Hannon, Jr. .............................. | 710/68 |
| 5,247,638 | 9/1993 | O'Brien et al. .......................... | 710/68 |
| 5,247,646 | 9/1993 | Osterlund et al. ....................... | 395/888 |
| 5,337,275 | 8/1994 | Garner ............................... | 365/189.01 |
| 5,341,339 | 8/1994 | Wells ................................. | 365/185.11 |
| 5,353,024 | 10/1994 | Graybill . | |
| 5,353,425 | 10/1994 | Malamy et al. ......................... | 711/144 |
| 5,357,614 | 10/1994 | Pattisam et al. ......................... | 710/68 |
| 5,371,499 | 12/1994 | Graybill et al. . | |
| 5,379,036 | 1/1995 | Storer . | |
| 5,396,343 | 3/1995 | Hanselman .............................. | 358/426 |
| 5,406,278 | 4/1995 | Graybill et al. . | |
| 5,406,279 | 4/1995 | Anderson et al. . | |
| 5,412,429 | 5/1995 | Glover . | |
| 5,414,425 | 5/1995 | Whiting et al. . | |

(List continued on next page.)

*Primary Examiner*—Eddie P. Chan
*Assistant Examiner*—Hong Kim
*Attorney, Agent, or Firm*—Conley, Rose & Tayon PC; Jeffrey C. Hood

[57] ABSTRACT

A flash memory controller and/or embedded memory controller including MemoryF/X Technology that uses data compression and decompression for improved system cost and performance. The Compression Enhanced Flash Memory Controller (CEFMC) of the present invention preferably uses parallel lossless compression and decompression engines embedded into the flash memory controller unit for improved memory density and data bandwidth. In addition, the invention includes a Compression Enhanced Memory Controller (CEMC) where the parallel compression and decompression engines are introduced into the memory controller of the microprocessor unit. The Compression Enhanced Memory Controller (CEMC) invention improves system wide memory density and data bandwidth. The disclosure also indicates preferred methods for specific applications such as usage of the invention for solid-state disks, embedded memory and Systems on Chip (SOC) environments. The disclosure also indicates a novel memory control method for the execute in place (XIP) architectural model. The integrated parallel data compression and decompression capabilities of the CEFMC and CEMC inventions remove system bottle-necks and increase performance matching the data access speeds of the memory subsystem to that of the microprocessor. Thus, the invention allows lower cost systems due to smaller data storage, reduced bandwidth requirements, reduced power and noise.

39 Claims, 24 Drawing Sheets

U.S. PATENT DOCUMENTS

| | | |
|---|---|---|
| 5,414,850 | 5/1995 | Whiting . |
| 5,420,696 | 5/1995 | Wegeng et al. .......................... 358/468 |
| 5,426,779 | 6/1995 | Chambers, IV . |
| 5,448,577 | 9/1995 | Wells et al. ............................. 714/767 |
| 5,455,577 | 10/1995 | Slivka et al. ............................... 341/51 |
| 5,455,943 | 10/1995 | Chambers, IV . |
| 5,459,850 | 10/1995 | Clay et al. ............................... 711/171 |
| 5,463,390 | 10/1995 | Whiting et al. . |
| 5,465,338 | 11/1995 | Clay ........................................ 710/130 |
| 5,477,264 | 12/1995 | Sarbadhikari et al. ................. 348/231 |
| 5,479,638 | 12/1995 | Assar et al. ............................. 711/103 |
| 5,485,526 | 1/1996 | Tobin . |
| 5,504,842 | 4/1996 | Gentile ................................... 358/1.15 |
| 5,506,580 | 4/1996 | Whiting et al. . |
| 5,526,363 | 6/1996 | Weiss et al. . |
| 5,532,693 | 7/1996 | Winters et al. . |
| 5,532,694 | 7/1996 | Mayers et al. . |
| 5,548,742 | 8/1996 | Wang et al. ............................ 711/128 |
| 5,553,261 | 9/1996 | Hasbun et al. .......................... 711/103 |
| 5,559,978 | 9/1996 | Spilo ....................................... 711/203 |
| 5,563,595 | 10/1996 | Strohacker ............................... 341/106 |
| 5,568,423 | 10/1996 | Jou et al. ............................ 365/185.33 |
| 5,572,206 | 11/1996 | Miller et al. . |
| 5,577,248 | 11/1996 | Chambers, IV . |
| 5,584,008 | 12/1996 | Shimada et al. ........................ 711/114 |
| 5,606,428 | 2/1997 | Hanselman .............................. 358/404 |
| 5,621,403 | 4/1997 | Reznik . |
| 5,640,529 | 6/1997 | Hasbun ................................... 711/103 |
| 5,696,912 | 12/1997 | Bicevskis et al. ....................... 395/308 |
| 5,729,228 | 3/1998 | Franaszek et al. . |
| 5,798,718 | 8/1998 | Hadady . |
| 5,812,817 | 9/1998 | Hovis et al. ....................... 395/497.04 |
| 5,828,877 | 10/1998 | Pearce et al. ........................... 395/670 |
| 5,874,908 | 2/1999 | Craft . |
| 5,877,711 | 3/1999 | Craft . |
| 5,883,588 | 3/1999 | Okamura . |
| 5,933,104 | 8/1999 | Kimura . |
| 5,936,560 | 8/1999 | Higuchi . |
| 5,945,933 | 8/1999 | Kalkstein . |
| 5,956,372 | 9/1999 | Vaman et al. . |
| 5,973,630 | 10/1999 | Heath . |

(New Art)

| Input Matches | | | | New Counter Value | Output Counter | Output Mask | Reset Value |
| --- | --- | --- | --- | --- | --- | --- | --- |
| D0 | C1 | B2 | A3 | | | | |
| 1 | 1 | 1 | 1 | Saved+4 | Saved+4 | 10000 | 0 |
| 1 | 1 | 1 | 0 | 0 | Saved+3 | 10001 | 1 |
| 1 | 1 | 0 | 1 | 1 | Saved+2 | 10010 | 2 |
| 1 | 1 | 0 | 0 | 0 | Saved+2 | 10011 | 2 |
| 1 | 0 | 1 | 1 | 2 | Saved+1 | 10100 | 3 |
| 1 | 0 | 1 | 0 | 0 | Saved+1 | 10101 | 3 |
| 1 | 0 | 0 | 1 | 1 | Saved+1 | 10110 | 3 |
| 1 | 0 | 0 | 0 | 0 | Saved+1 | 10111 | 3 |
| 0 | 1 | 1 | 1 | 3 | Saved | 11000 | 4 |
| 0 | 1 | 1 | 0 | 0 | Saved | 01111 | 1 |
| 0 | 1 | 0 | 1 | 1 | Saved | 11010 | 4 |
| 0 | 1 | 0 | 0 | 0 | Saved | 11011 | 4 |
| 0 | 0 | 1 | 1 | 2 | Saved | 11100 | 4 |
| 0 | 0 | 1 | 0 | 0 | Saved | 11101 | 4 |
| 0 | 0 | 0 | 1 | 1 | Saved | 11110 | 4 |
| 0 | 0 | 0 | 0 | 0 | Saved | 11111 | 4 |

| A/B | B/C | C/D | D/A | A/C | B/D | Output |
|---|---|---|---|---|---|---|
| 0 | X | X | 1 | 0 | X | A |
| 1 | 0 | X | X | X | 0 | B |
| X | 1 | 0 | X | 1 | X | C |
| X | X | 1 | 0 | X | 1 | D |

Fig. 21

| Bytes Compressed | Flag | Index | Count | Data | Bits Used |
|---|---|---|---|---|---|
| 0 | 0 | - | - | 8b | 9 |
| 1 | 10 | 6b | - | - | 8 |
| 2 | 1100 | 6b | - | - | 10 |
| 3 | 1101 | 6b | - | - | 10 |
| 4 | 1110 | 6b | - | - | 10 |
| 5 | 1111000 | 6b | - | - | 13 |
| 6 | 1111001 | 6b | - | - | 13 |
| 7 | 1111010 | 6b | - | - | 13 |
| 8 | 1111011 | 6b | - | - | 13 |
| 9 | 1111100 | 6b | - | - | 13 |
| 10 | 1111101 | 6b | - | - | 13 |
| 11 | 1111110 | 6b | - | - | 13 |
| >11 | 1111111 | 6b | 12b | - | 25 |

| Previous Select | 10 | 08 | 04 | 02 | 01 | 00 |
|---|---|---|---|---|---|---|
| My ID=01 | 1F | 1F | 1F | 1F | 1F | 00 |
| My ID=02 | 1F | 1F | 1F | 1F | 1F | 00 |
| My ID=04 | 1F | 1F | 1F | 1F | 1F | 00 |
| My ID=08 | 1F | 1F | 1F | 1F | 1E | 00 |
| My ID=10 | 1F | 1E | 1E | 1E | 1E | 00 |
| My ID=20 | 1E | 1E | 1E | 1C | 00 | 00 |
| My ID=40 | 1E | 00 | 00 | 00 | 00 | 00 |
| My ID=80 | 08 | 00 | 00 | 00 | 00 | 00 |

Fig. 25a

| Select | 10 | 08 | 04 | 02 | 01 | 00 |
|---|---|---|---|---|---|---|
| Data Byte | X | D1:D8 | X | X | X | X |
| Index | D2:D7 | X | D4:D9 | D7:D12 | D7:D12 | X |
| Count | PC+1 | PC+1 | D2:D3+PC+2 | D4:D6+PC+5 | D13:D24+PC | X |

Fig. 25b

PARALLEL DECOMPRESSION AND COMPRESSION SYSTEM AND METHOD FOR IMPROVING STORAGE DENSITY AND ACCESS SPEED FOR NON-VOLATILE MEMORY AND EMBEDDED MEMORY DEVICES

CONTINUATION DATA

This is a continuation-in-part (CIP) of U.S. patent application Ser. No. 09/239,659 titled "Bandwidth Reducing Memory Controller Including Scalable Embedded Parallel Data Compression and Decompression Engines" and filed Jan. 29, 1999 (5143-01700).

FIELD OF THE INVENTION

The present invention relates to computer system architectures, and more particularly to a Non-volatile "Flash" memory and embedded memory controllers, which includes embedded data Decompression and/or Compression engines for increased effective memory density and improved bandwidth.

DESCRIPTION OF THE RELATED ART

Non-volatile storage devices such as EPROMS (Erasable Programmable Read Only Memories), and EEPROMS (Electrically Erasable Programmable Read Only Memories) have stored computer instruction code and data since their introduction. The architecture of non-volatile semiconductor devices has remained substantially unchanged over recent years. Flash memory semiconductors have recently surfaced as the more modem non-volatile storage device allowing fast in circuit re-programmability. Flash memory devices are becoming more popular because of fast read and write response, low cost and higher density. Still, the cost per storage bit of Flash memory exceeds that of volatile DRAM (Dynamic Random Access Memory) or SRAM (Static Random Access Memory) devices. Flash memory devices currently are sold into two major marketplaces, the "solid-state disk" and "embedded systems" for program and data storage. Additionally, system on a chip (SOC) shows promise for embedded flash memory coupled to embedded MPU, (Micro Processor Unit) SRAM, DRAM, and analog circuits for execution of programs stored in such non-volitile flash memory circuits. While solid-state disks are used widely for "rugged" non-mechanical, non-volatile storage and lower power, embedded systems use flash memory for program and data storage typically for software field upgrades that reduce the cost of support and maintenance. Some embedded flash systems use the XIP (execute in place) architecture. Here, the instructions and data are read directly from the Flash memory device by the embedded Central Processing Unit (CPU) or MPU for direct execution. In prior art, the top end frequency of operation was slaved to the bandwidth (instruction and data read rate) of the flash memory subsystem. Thus, higher speed embedded processors, in order to read from the flash directly (XIP model), had to lower their clocking rate due to slow read and write timing from the Flash Memory Array 100. To avoid low frequency operation some systems will copy flash data for execution to DRAM or SRAM allowing for faster execution at increased cost due to additional subsystem memory devices. The current state of the art of Flash memory devices include a central processing unit (CPU) coupled to optional error correction controller (ECC), Flash Memory Array 100 for storage, and charge-pumps for program voltage derivation. Non-monolithic Flash memory devices typically comprise two or three devices, such as the Flash Memory Array, the Flash controller, and DC to DC converter and supply voltage generator. These Flash controllers typically couple to a bus interface such as PCMCIA (Personal Computer Memory Card International Association), ISA (Industry Standard Architecture) or a proprietary CPU bus, and also to the Flash memory storage array with an address, data, and control bus interface. For monolithic or non-monolithic, devices the purpose of the Flash memory controller is for orchestration of read and write transfers of data between the main CPU and the memory subsystem. Typically the program running on the embedded CPU, in prior art flash memory controller circuits, includes control functions (Sleep, Wake, Seek, Compare, load and store) for proper Flash memory programming and "wear" balancing. Wear balancing is due to the limit of writes that flash can handle before faults begin to occur. Thus, for solid-state disks where data is written more often, a "wear balancing" program running on the embedded CPU will optimally write data to areas that have less access, thus prolonging the effective life of the flash device.

Certain prior art systems utilize multiple Flash memory devices with parallel combined data output pins to gain improved memory bandwidth. The multiple Flash devices are in many instances included primarily for added bandwidth, and when only the added bandwidth is needed, additional cost is incurred due to the multiple Flash memory packages required. Additionally, prior art Flash memory systems have proven too expensive (cost per bit storage) for high density mass market applications and thus have not sold in substantial volumes to warrant dramatic cost reductions. Therefore, a new system and method is desired to increase the effective read bandwidth requirements required by the Execute In Place model and the solid state disk market for embedded applications and operating system software, while reducing the cost per bit of non-volatile Flash memory storage, thus establishing a new price per bit and read access performance for non-volatile Flash memory data and program storage.

SUMMARY OF THE INVENTION

The present invention comprises a Flash Memory Controller with embedded parallel compression and/or decompression capability, also referred to as the Compression Enhanced Flash Memory Controller (CEFMC), which provides improved data density, efficiency and bandwidth. To enhance the XIP performance of the CEFMC, the present invention uses a decompression engine coupled to an SRAM memory buffer, optionally configured as a data cache which is coupled to an interface bus such as the ISA, PCMCIA, PCI, Card-Bus or MPU proprietary bus. The memory controller also couples either directly, or through a temporary data latch, to the Flash Memory Array. In the preferred embodiment the parallel decompression engine couples through a data latch to a wide row of the Flash Memory preferably embedded on the same silicon device. The wide Flash Memory Array is typically the row-width of the normal memory array such as 256 or 512 data bits. This array is preferably coupled through a storage latch, which preferably allows the next read address to pre-fetch data from the Flash Memory Array prior to completion of the decompression stage. Further, in one embodiment of the present invention, data has been pre-compressed by a software compiler tool prior to the write of such data into the Flash Memory Array. Alternatively, for systems that require dynamic write capability to the Flash Array, as in file system or solid state disk operation, a compression engine is added "in-line" with data also preferably located within the Flash memory control circuit The CEFMC is designed for the reduction of data bandwidth and is located between the main memory and/or system memory and the flash memory controller. The CEFMC Technology reduces the bandwidth requirements while increasing the memory efficiency for almost all data types within the computer system. Thus, conventional standard Flash Memory cells can achieve higher bandwidth, more effective density, with less system power and noise than when used in conventional systems without the CEFMC technology.

The CEFMC transfers data between the Flash Memory Array and the system MPU and its optional execution and data memories. Therefore, the CEFMC technology of the present invention typically resides between the MPU, main memory and the Flash Memory Array. In an alternate embodiment, the compression and/or decompression engines may reside in the MPU memory control unit, thus all memory data including flash memory can make use of lower pin-out interconnect buses, more effective memory performance, and increased effective memory density for all types of memory coupled to the MPU device.

The CEFMC technology is designed to embed into prior art flash memory control circuits. Thus, the current invention, using the novel parallel architecture to compress and decompress data streams, substantially improves bandwidth and effective storage density within the computing system. In addition, the CEFMC Technology has a "scalable" architecture designed to function in a plurality of memory configurations or compression modes with a plurality of performance requirements as indicated in U.S. patent application Ser. No. 09/239,659 titled "Bandwidth Reducing Memory Controller Including Scalable Embedded Parallel Data Compression and Decompression Engines" and filed Jan. 29, 1999 (5143-01700). Scalability allows for a non-symmetric compression rate as compared to the decompression rate. Write data can match the effective write speed of the Flash Memory Array, using fewer input symbols in parallel during compression, thus reducing gate count and size. Read data can be decompressed with a different number of input symbols per clock or access, thus allowing the read data to be decompressed at an alternate rate. Thus, the non-symmetric nature of the invention during reads and writes allows tuning of the memory access time vs. gate count to greatly improve performance and cost.

When configured for "execute in place" (XIP model), compressed data is programmed in to the flash memory for execution by the system MPU. The CEFMC invention decompresses the data as it is read by the MPU from the flash memory. In an alternate embodiment a DMA device can also be used to read data in a parallel fashion from the flash memory device. In the preferred embodiment, data presented at the output bus of the Flash Memory system is retrieved when the "ready" output (ready is a control signal associated with the MPU and Flash controller interface) transitions state during a read data request. The "ready" output indicates that the data has been successfully read from the Flash Memory Array and decompressed for consumption by the MPU. Any form of ready output indication can be used, as the "wait" is due to the decompression of a new block of data not previously stored in the SRAM buffer or cache. Alternatively, the timing specifications can include delay time specification indicating a "maximum delay" such that the MPU of system device waits for some period of time in order to process the decompressed requested data.

The CEFMC technology allows data to be stored in multiple compression formats and blocks sizes, as indicated in U.S. patent application Ser. No. 09/239,659 titled "Bandwidth Reducing Memory Controller Including Scalable Embedded Parallel Data Compression and Decompression Engines", referenced above. Thus, data can be saved in either a normal or compressed format, retrieved from the Flash Memory Array for MPU execution in a normal or compressed format, or transmitted and stored on a medium in a normal or compressed format.

To improve latency and reduce performance degradations normally associated with compression and decompression techniques the CEFMC encompasses multiple novel techniques such as: 1) Compiler directives for data types and block sizes for optimal compression and access speeds; 2) parallel lossless compression/decompression; selectable compression modes such as lossless, lossy or no compression; 3) data caching techniques; 4) unique address translation, attribute, and address directory structures, as illustrated in U.S. patent application Ser. No. 09/239,659, referenced above.

The CEFMC Technology preferably includes novel parallel compression and decompression engines designed to process stream data at more than a single byte or symbol (character) at one time. These parallel compression and decompression engines modify the single stream dictionary based (or history table based) data compression method described by Lempel and Ziv to provide a scalable, high bandwidth compression and decompression operation. The parallel compression method examines a plurality of symbols in parallel, thus providing greatly increased compression performance. The CEFMC technology, in an alternate embodiment, reduces latency further by use of multiple compiler hooks to distinguish program data space from table look-up data. Thus, if indicated, a bypass of the decompression engine will send data directly to the output interface bus without delay. A priority scheme can be applied such that compression and decompression operations are suspended as higher priority non-compressed data is transferred. Thus, reduction of latency and improved efficiency can be achieved at the cost of additional parallel buffers and comparison logic. Compiler directives interpreted by the decompression controller, can be embedded within the compiled XIP code for notification of compression/decompression bypass.

In summary, the integrated data compression and decompression capabilities of the present invention removes system bottlenecks allowing a higher frequency MPU clock by de-coupling the Flash Memory access time from MPU clock frequency. In addition, the present invention reduces the data storage size allowing more storage per Flash Memory Array. This lower cost system is due to reduced data storage requirements and improved bandwidth results. This also increases system bandwidth and hence increases system performance. Thus the compression based Flash Memory Controller of the present invention is a significant advance over the operation of current memory controllers.

BRIEF DESCRIPTION OF THE DRAWINGS

A better understanding of the present invention can be obtained when the following detailed description of the preferred embodiment is considered in conjunction with the following drawings, in which:

FIG. 15 shows the operation of the counter values, output counter and output mask used for output selection during the parallel compression operation of the present invention;

FIG. 20 illustrates the logic table for the high speed parallel comparison;

FIG. 21 is a table illustrating the header information presented to the lossless decompression engine;

FIG. 25a is a table indicating the check valid results table of the decode block; and FIG. 25b is a table describing the Data Generate outputs based on the Data Input and the Byte Check Select logic.

DETAILED DESCRIPTION OF THE PREFERRED EMBODIMENT

Incorporation by Reference

U.S. patent application Ser. No. 09/239,659 titled "Bandwidth Reducing Memory Controller Including Scalable Embedded Parallel Data Compression and Decompression Engines", which was filed on Jan. 29, 1999 (5143-01700), is hereby incorporated by reference in its entirety as though fully and completely set forth herein.

Prior Art Computer System Architecture

Figure 1:
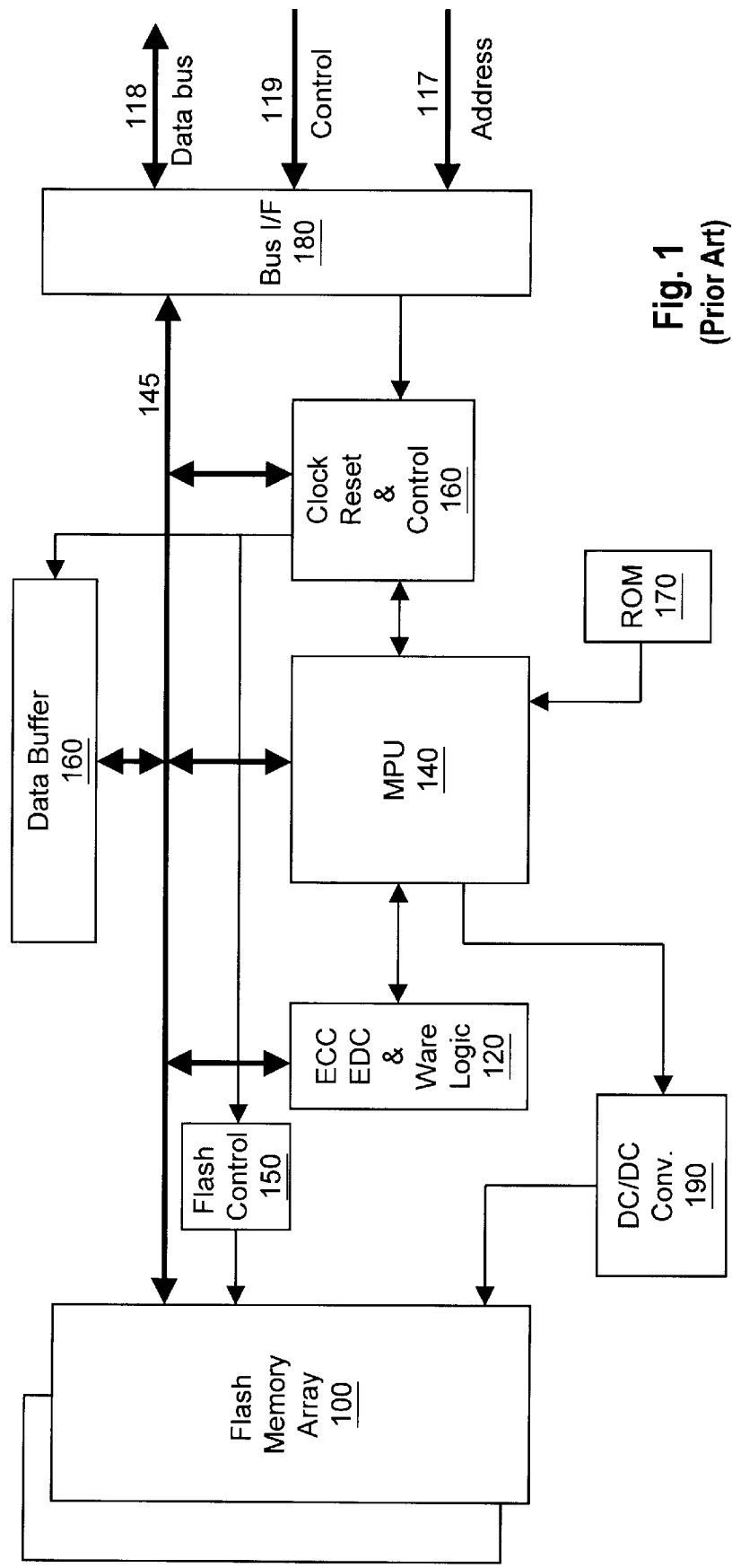
FIG. 1 illustrates a typical embodiment for the prior art Flash Memory Controller architecture without Compression Enhancement for the solid-state disk.

FIG. 1 illustrates a block diagram of a prior art Flash Memory Controller architecture. Prior art flash memory systems are often too expensive on a "per-bit" basis as compared to hard disk drive devices for data storage. The higher cost is offset by both lower power and harsh environment operation where disk substitutes must be chosen. Prior art Flash memory controllers typically include an MPU 140 or hard wired instruction A interpreter (not shown), coupled to logic for error correction and detection and flash ware logic (120), coupled to the main Flash Memory Array interface logic 150. The MPU 140 is used to regulate the Flash memory access cycles and control operation to mimic standard disk drive protocol. The MPU 140 is typically coupled to an internal address/data bus 145 which couples to the bus I/F 180, the Control logic block 150, the Error detection and Correction block 120 and finally to the Flash Memory Array 100. Also, for data that requires a plurality of writes to the same address range, load leveling logic or "wear logic" 120 is employed to spread the write cycles to alternate Flash Memory Array blocks. This action increases the life expectance of a particular area of the flash array by write block distribution. Thus, an address and data bus 145 is the main connection between the logic blocks for transmission of address and data within the Flash Memory Controller system. Data from the external interface is connected to the internal Bus Interface logic 180 which also couples to the main address and data bus 145 and the Flash Memory Controller Reset and Control block 160. Reset and control is needed to power on and "ready" the Flash Memory Array 100, the MPU 140 and initialize the Error Correction and Detection block 120. The data buffer 160 is used in two ways during read and write cycles. During read cycles from the Flash Memory Array 100, and under control of the Bus Interface 180, the data buffer 160 acts as a depository for flash data that is read from the Flash Memory Array 100 under request of the system bus control 119 and system bus address 117. During write cycle requests from the bus interface unit 180, the data buffer 160 acts as a write posting buffer for large blocks of data to be written into the Flash Memory Array 100. Due to the long write access time and block clear functions of the flash array 100, the data buffer 160 can de-couple the system write speed from the slow Flash Memory Array 100 write speed. Typically the write speed is ¼ the read time due to the nature of the Flash Memory Array 100. In addition, a Flash Memory Control block 150, coupled to the main control logic block 160, controls the strobes for data access or deposit into the Flash Memory Array 100. Illustrated in FIG. 1 is also an embedded ROM 170. This ROM is necessary to initialize and reset the MPU 140 for proper operation and execution of commands. A DC to DC converter 190 is coupled to the Flash Memory Array 100 for generation of the proper operation voltages. Currently prior art systems for solid state disk control such as the one of FIG. 1 are used primarily for code storage and execution by an external CPU device, with a functional operation similar to a mechanical system disk.

Figure 2:
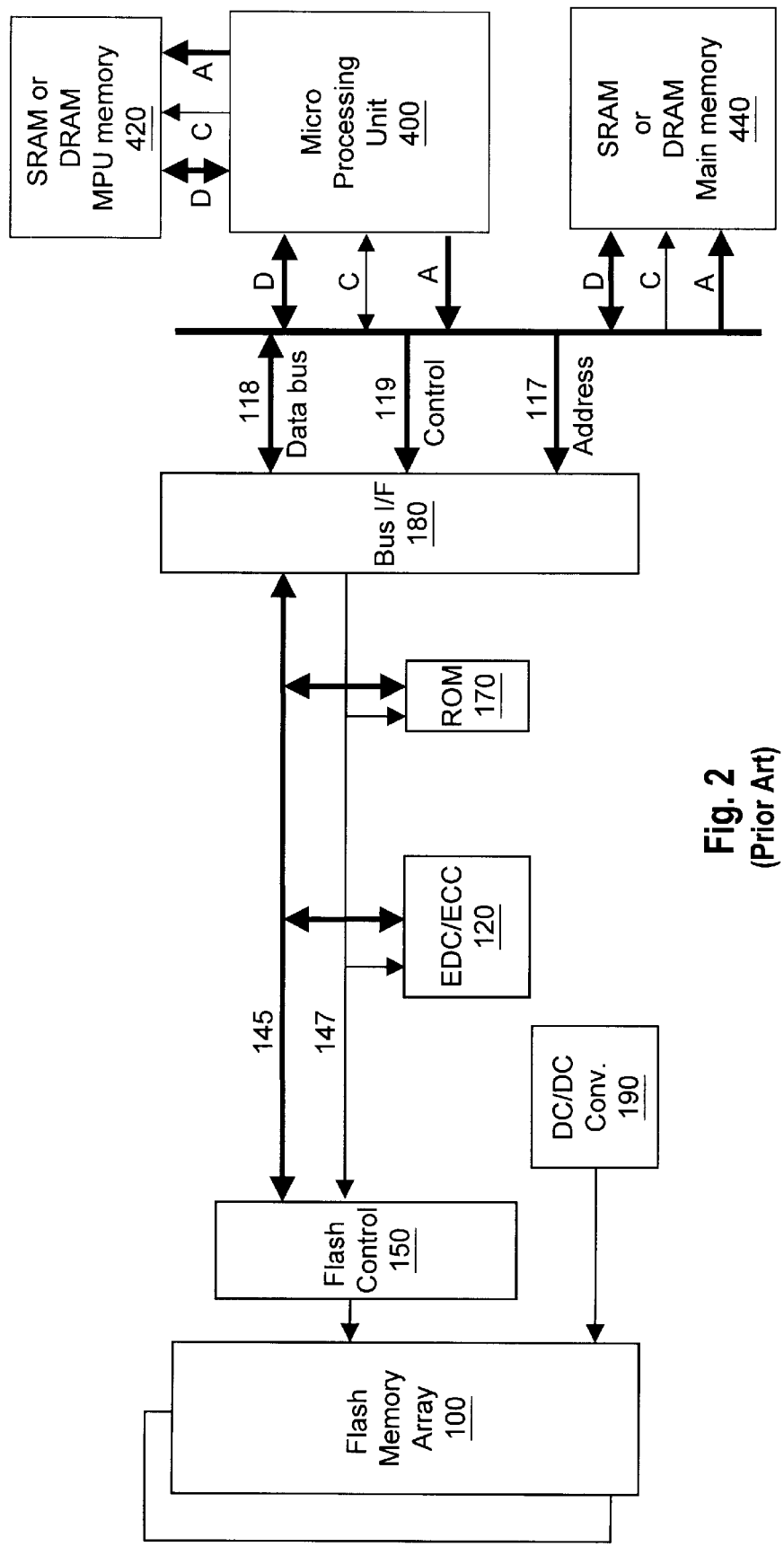
FIG. 2 illustrates a typical embodiment for the prior art Flash Memory Controller without Compression Enhancement for the execute in place (XIP) model.

The system of FIG. 2 shows the prior art used to store instructions and data used by an external CPU 400, external CPU dedicated memory 420, or external system memory 440 all supporting the execute in place (XIP) mode of operation. In some prior art systems the external CPU, dedicated memory 420, and system memory 440 may be integrated into the same device or into separate non-monolithic devices. The XIP model allows the system CPU 400 to run with direct instruction access from the Flash Memory Array 100. In the prior art of FIG. 2, a bus interface 180 may be coupled to an external or embedded CPU 400, and memory 440 by the Data bus 118, the Control bus 119 and the address bus 117. The internal address and data bus 145 is coupled between the bus interface unit 180 and the Flash controller logic 150. In addition, the address and data bus 145 couples to an internal Error Correction and Error Detection unit 120, and to the internal boot ROM 170 which also couples to the Flash controller 150 and the Bus interface logic 180. The internal control bus 147 also couples to the Bus Interface 180, the Boot ROM 170, the EDC/ECC logic block 120 and the Flash Memory Controller unit 150 used to control the read and write operation as indicated by the external or embedded CPU connected to the other side of the Bus Interface unit 180. A DC to DC converter 190 is used to generate the necessary program and clear voltages needed to run the Flash Memory Array 100.

The XIP prior art model illustrated in FIG. 2 is often too slow to run instruction and data cycles directly to the CPU interface without either slowing down the CPU 400 clock to match the access times of the Flash Memory Array 100 or inserting wait states in data access cycles from the Flash Memory Array 100. This is due to the relatively slow access speed from the Flash Memory Array 100. Thus, a system to increase both the storage density and the read access bandwidth is desired as outlined in the present invention.

Computer Architecture of the Preferred Embodiment

The embodiment of the present invention teaches a method of using fast parallel compression and decompression technology as outlined in patent application Ser. No. 09/239,659 titled "Bandwidth Reducing Memory Controller Including Scalable Embedded Parallel Data Compression and Decompression Engines" and filed Jan. 29, 1999 (5143-01700), to increase the effective density and read access time of non-volatile storage devices such as flash memory integrated circuits. As flash memory is used more on high speed buses, multiple flash devices must be used in parallel to obtain the bandwidth of the higher speed buses. This increase in devices or array row size in embedded flash becomes more costly to implement as the data path grows in width. By merit of the present invention, Flash Memory Array data is decompressed to a higher delivery bandwidth, thus, the need for multiple parallel devices or wide row interfaces for embedded flash is not necessary. Increased bandwidth rates are complemented by the additional flash data and program storage space of the present invention. In the preferred embodiment of the present invention the invention may be integrated onto the flash memory controller IC, which also preferably can be integrated directly onto the flash memory storage cell array to form a single monolithic IC for non-volatile data and program storage.

Figure 3:
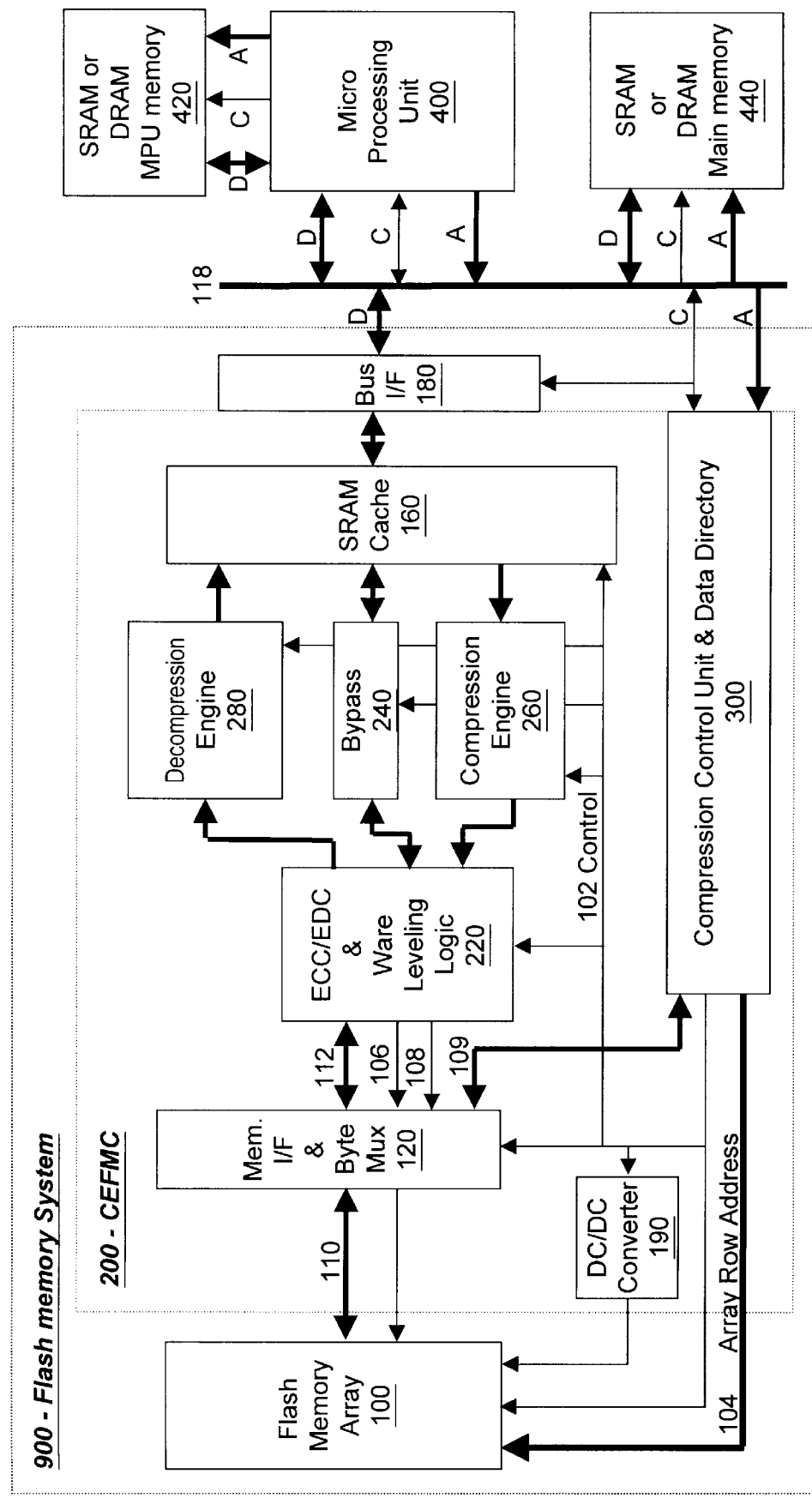
FIG. 3 illustrates the Flash Memory Controller with embedded parallel Compression and Decompression engines.

FIG. 3 illustrates the preferred embodiment for the flash memory device when used for non-volatile storage in a computer or computing appliance. Typically the embodiment of FIG. 3 is used for file system software control similar to the operation of a mechanical hard disk. In fact, solid-state Disk systems will follow the exact protocol standards as mechanical hard drives use. As system buses increase in speed and drive interface specifications are adopted to higher speed drive interfaces, such as 66 Mhz PCI, a higher speed compression technology is required to service application specific markets such as the solid state disk market as disclosed in this invention. In order to read and write compressed data, FIG. 3 illustrates both the parallel compression and parallel decompression engines 260 and 270. This disclosure focuses on the use of flash memory devices with compression and decompression for file system storage and retrieval (as in solid state disks applications) and the execute in place model (XIP in embedded applications). In the preferred embodiment both compression and decompression engines are present for data and program storage and retrieval. Alternate embodiments may use only the parallel decompression engine, as compression is used only for write data when writes to the Flash Memory Array 100 are seldom. Thus, write data in this alternate embodiment may be compressed by a software routine running in the main CPU 400 such that there is no need for the parallel hardware compression unit. Again, referring to FIG. 3, the preferred embodiment for the solid state disk system 900 is illustrated. The Compression Enhanced Flash Memory Controller (CEFMC) 200 is comprised of the System Bus Interface unit 180, a Buffer SRAM 160, which alternately could be configured as a cache memory structure, the compression engine 260, decompression engine 280, the bypass logic 240, Error Correction and Detection including flash block address generation for wear control 220, the DC to DC Converter 190 and finally the Flash Memory Array byte multiplexes and memory control interface 120.

The CEFMC 200 Flash Memory Controller is preferably coupled to the System Bus 118 and the Flash Memory Array 100. While prior art systems may contain ECC/EDC 220 and DC/DC converters 190, the present invention has novel blocks for fast access of compressed and decompressed data transfers. The System Bus Interface logic 180 couples to the System Bus 118 and to the Flash Controllers SRAM Buffer 160. The purpose of the interface logic is to present Address 117, Data 118, and Control 119 according to the System Bus Interface standard. Such interfaces may be PCI, Card-Bus, PCMCIA, Local CPU 400 bus, etc. The Bus interface unit 180 performs the necessary timing of address and data as well as control strobes during access of the System Bus 118. The Flash memory controller of the present invention also may use an optional SRAM Buffer 160. The Storage Buffer 160 may be configured as a cache memory for alternate embodiments. The SRAM cache memory 160 of the present invention de-couples the bus timing and control requirements from the Flash Memory Array and compression/decompression process. The SRAM Buffer 160 may be coupled to the Decompression Engine 280, the Bypass Logic 240 and the Compression Engine 260, as well as the Compression Control Unit 300, and the Bus Interface Unit 180. The compression block size and the amount of SRAM buffer storage may be related. For solid-state Disk applications of the preferred embodiment, the size of the buffer only need be large enough to effectively keep data in a "streaming manner" from the Flash Memory Array 100 to the System Bus Interface 180. Thus, because the parallel compression and decompression process is fast enough, it can process the data in a streaming manner with the compression or decompression process "in-line" between the System Bus 118 and the Flash Memory Array 100. In the XIP embodiment, this buffer becomes more substantial in size and becomes a caching memory where preferably the cache block size is equal to the compression block size and the overall cache size is preferably at least 4X the compression block size. The SRAM Buffer 160 is controlled by the Compression Control Unit and Data Directory 300 as data traverses between the System Bus 118 and the Flash Memory Array 100. The Compression Control Unit 300 is responsible for load and unload of data to and from the SRAM Buffer 160. In addition, the SRAM Buffer 160 may be multi-ported or single-ported depending on the application requirements.

As indicated in FIG. 3 the ECC/EDC and Ware Leveling Logic 220 are preferably coupled to the Decompression Engine 280, the Bypass latches 240, the Compression Engine 260, and the Flash Memory Interface and Byte Multiplexing Logic 120. The purpose of the ECC/EDC and ware leveling logic are no different than in prior art solid state disk controllers. Error Correction/Detection is used to correct data that has different data between the write and the read of such data. A ware leveling process is used to keep the data written to the non-volatile memory distributed across the entire Flash Memory Array 100 in order to keep the device from premature data retention failure. Typically in the XIP model, these units are not required but may be used for added data quality.

The parallel Decompression Engine 280 is coupled to the SRAM buffer 160. The Decompression engine 280 reads data from the ECC/EDC control unit 220 or in alternate embodiments directly from the Flash Memory Array interface logic and Multiplexer 120, or may interface directly from the Flash Memory Array 100. The Decompression engine 280 is also coupled to the Compression Control Unit 300. The purpose of the Decompression Engine is to expand compressed data that is read from the Flash Memory Array 100, thus increasing the effective density of the Flash Memory Array 100 and increasing the effective data bandwidth and transfer rate onto the output System Bus 118. The decompression engine 280 receives control and directory information from the Compression Control unit 300 for instructions during the decompression process of the data. Included within this 15[] control is the initialization of new compression blocks and block sizes. In addition, the decompression engine 280 informs the Compression Control unit 300 about data fetch requirements to keep the decompression pipe-line full.

A Bypass Unit 240, coupled to the SRAM Buffer 160, the ECC/EDC 220, or in alternate embodiments directly to the flash memory interface 120, does nothing to the data during transfer operations. Instead, the Bypass Unit 240 is coupled to the Compression Control Unit 300 for the process of passing data without compression or decompression operation. The Bypass Unit 240 is preferably a set of bi-directional multiplexors for such purpose. Also in the preferred embodiment, the bypass unit 240 is instructed by the Compression Control unit 300 when data is to be compressed, decompressed or bypass compression altogether. Instructions to the Compression Control unit 300 to "bypass" compression may come from embedded directives compiled into code which runs on the CPU 400 or directly from the Compression Control Unit 300 based on Bus Control signals 119 from the System Bus 118 which indicate block sequential or singular read/write operation. As an example, in the XIP model, look up table information which typically is random reads on small or single values would not benefit from the block compression of the present invention. These lookup tables may be flagged by the compiler (or programmer) as data fields that should not be compressed. Thus, data of this type may be read without additional latency caused by the decompression operation.

In addition in the preferred embodiment is a compression engine 260 which is also coupled to the SRAM Buffer 160, the ECC/EDC Unit 220 or alternatively directly to the flash memory interface 120, and to the Compression Control unit 300. Compression engine 260 of the present invention is only necessary if real time, high speed compression is necessary on write data to the Flash Memory System 900. In alternate embodiments, such as the XIP model, the compression engine 260 is not necessary as either the Main CPU 400, or the compiler can compress the instructions and data values in non-real-time as a preoperation to actual execution of the instructions or usage of the data. In the preferred embodiment, for computer system file storage these writes are necessary and are a regular component of the flash system 900. In this environment it is necessary to compress data for file system storage and thus a parallel compression engine 260 is desirable.

Again in reference to FIG. 3, the Compression Control unit and Data Directory 300 performs all control of the logic blocks indicated and performs address translation for the compression directory services. As indicated in FIG. 3 the Compression Control unit 300 has a data bus 109 that couples to the memory interface 120. In the preferred embodiment "header-data" is multiplexed into the compressed data stream for storage along with the compressed data into the Flash Memory Array 100. The Compression Control unit contains a translation unit that converts the input request address 117 into compressed block address used to access compressed blocks from the Flash Memory Array during decompression. The Compression Control block 300 may couple to the Bus Interface Unit 180, the SRAM Buffer 160, the Compression Engine 260, the Bypass Unit 240, the Decompression Engine 280, the ECC/EDC unit 220, the flash memory interface unit 120 the DC/DC Converter 190 and finally the Flash Memory Array 100. Control of all the internal blocks is preformed by the Compression Control Unit 300. Thus, in the preferred embodiment, the Compression Control unit 300 is the main control unit for the CEFMC 200.

The Flash Memory Array 100 comprises non-volatile flash memory storage cells with standard array row address and control for reads, writes, and programming of the cells in the array. In addition the Flash Memory Array 100 couples to a DC/DC Converter 190 in-order to clear flash memory blocks within the Flash Memory Array 100. The Compression Control unit 300 also may couple to the Flash Memory Array 300 for additional control during program, reads, and writes of the array. The Flash Memory Data Bus 110 may be of varying widths as necessary for the process of the array or for specific application environments. In the preferred embodiment, the array 100 is monolithic with the CEFMC 200 and the data bus 110 from the array is 128 bits or wider. This width is also dependent on the final data transfer rate of the preferred invention and is documented later in this disclosure.

Figure 4:
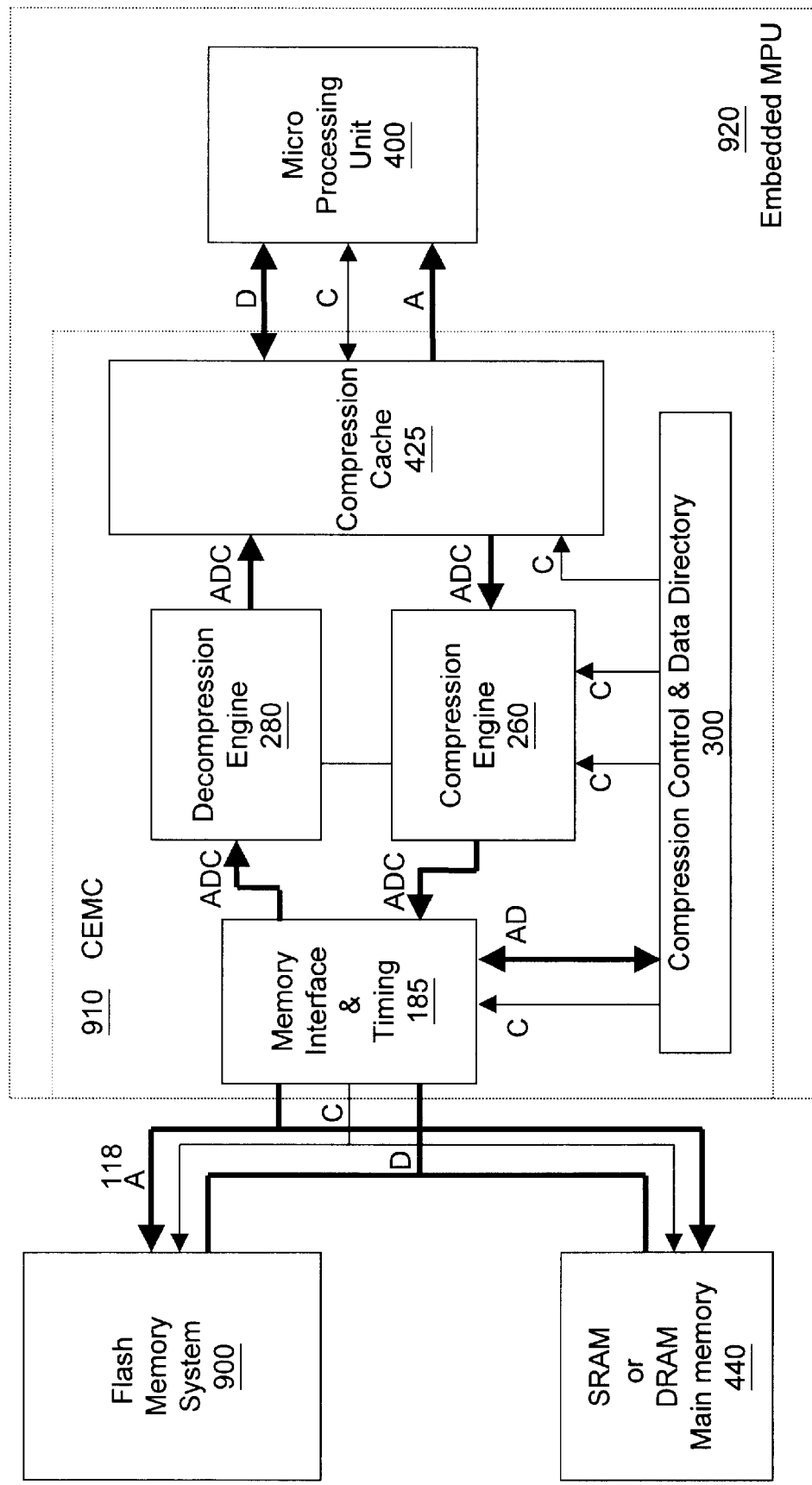
FIG. 4 illustrates the embedded parallel Compression and Decompression Engines embedded into the MPU for the system memory control interface.

In alternate embodiments, the same benefit of compression and decompression can be achieved by use of the compression and decompression engines at the Microprocessor 400 memory control interface. As illustrated in FIG. 4, the Compression Enhanced Memory Controller (CEMC) 910 of the present invention may be implemented as an external or embedded unit in the MPU 400 device. Thus, the entire system can benefit from the parallel compression and decompression procedure of the present invention. FIG. 4 shows the preferred embodiment of the MPU unit 400, the dedicated Compression Cache 425, the decompression engine 280, Compression Engine 260, Compression Control and data directory unit 300, and the Memory Interface and Bus Timing unit 185. MPU unit 400 may also include bypass logic (not shown). The Compression Enhanced Memory Controller (CEMC) unit 910 is coupled to the Micro Processing Unit 400 which preferably in combination forms the embedded MPU unit 920. The embedded MPU Unit 920 is coupled to the Flash Memory System 900 (which in this alternate embodiment does not require the present inventions CEMFC 200, and may be implemented with the prior art system of FIG. 1 or FIG. 2). The embedded MPU 400 is preferably coupled to the Flash Memory System 900 and to the main memory bank 440 of the system. In this embodiment, all units may be configured as a system on chip (SOC) or as individual components in a non-monolithic environment. Thus, Embedded Memory 440, typically orientated in arrays, represent on-chip data storage area for volatile containment of instructions and data. Embedded memory typically is of Static Random Access Memory (SRAM) or Dynamic Random Access Memory (DRAM) form. In the present embodiment of the CEMC 910, Compression Cache memory 425 is coupled to the Micro Processor Unit 400, the Decompression engine 280, the compression engine 260, the bypass logic 240 and the Compression Control unit 300. The Memory interface and timing unit 185 is coupled to the System Interface Bus 118 and performs the proper timing, address, data, and control interface to the Bus 118 according to the system bus protocol specifications. The memory interface 185 also couples to the Compression Control unit 300, Decompression Engine 280, Bypass Logic 240 and the Compression Engine 260. The memory interface and timing unit 185 performs the data transfer functions between the compression and decompression engines and the system interface 118. In addition, the memory interface and timing unit 185 controls the data transfer between the Flash Memory System 900 and the main memory bank 440.

Operation of the CEMC 910, as illustrated in FIG. 4, is to compress data and assign directory information to the compressed data transferred between the Cache Memory unit 425 and external system memory such as the Flash Memory Array 900 and/or the main memory 440. Control of compression operation address locations and compression block size is under software or firmware control. Software or firmware instructions for such controls located in embedded or external ROM, the Flash Memory System 900, or in Main Memory 440. In addition, the MPU 400 may read decompressed data from the Compression Cache 425, the Flash Memory System 900, the Main Memory 440 or other external memory systems not shown in FIG. 4. Data that has been stored compressed in the Flash Memory System 900 or System Memory 440, is decompressed and either executed directly from the Decompression Engine 280, or decompressed, stored in the Compression Cache 425 for execution by the MPU 400. The Compression Cache Control unit 300 preferably performs the cache control functions by looking at the address from the MPU 400 and making the determination for compression, decompression, bypass, or cache hit operations.

Figure 5:
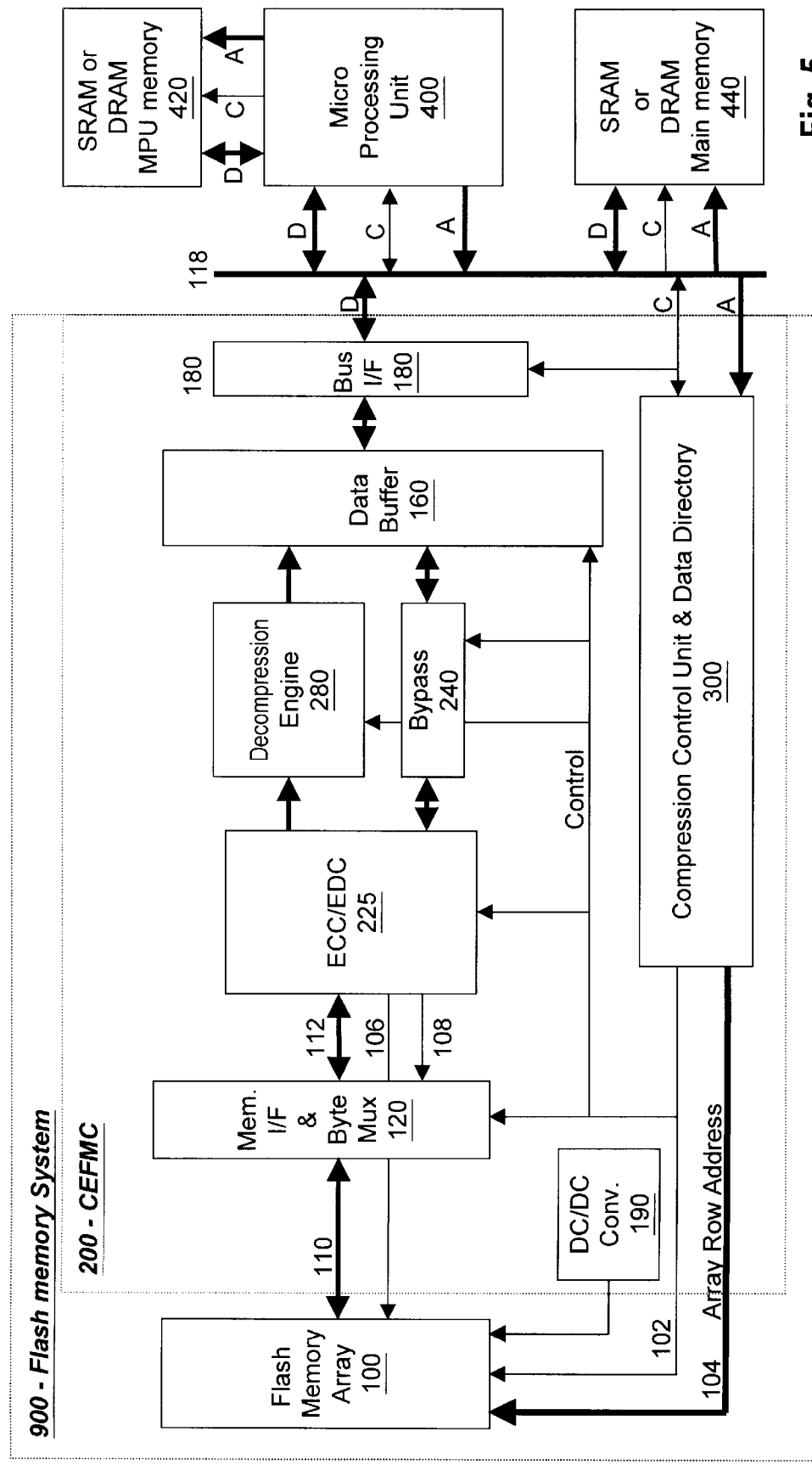
FIG. 5 illustrates the preferred embodiment for the execute in place (XIP) model when only real-time data decompression is necessary.

Another possible embodiment of the XIP model is shown in FIG. 5. Here the CEFMC is illustrated without the Compression Engine 260 shown in the CEFMC of FIG. 3. FIG. 5 shows the Main Memory 440 and the MPU 400 coupled to the System Bus 118, which is coupled to both the Bus Interface1 80 and the Compression Control Directory 300. The Data Buffer 160 is coupled to the Bus Interface 180 and to both the Decompression Engine 280 and the bypass logic 240. The Error Correction and Error Detection Controller 225 is coupled to both the Decompression Engine 280 and the Bypass Logic 240, and to the Flash Memory Interface and byte multiplexes 120. As indicated, the ECC/EDC unit of the current embodiment does not require the "ware logic" as in the solid state disk environment. This is due to the fact that writes to the flash array in the current embodiment are very seldom done; usually only for field upgrades of firmware. The Flash Memory Interface 120 is coupled to the Flash Memory Array 100. The Compression Control Unit 300 connects to the System Bus 118, the Bus Interface Unit 180, the Data Buffer 160, the Decompression Engine 280, the Bypass Logic 240, the ECC/EDC unit 225, the flash memory interface 120 and the Flash Memory Array 100. In this present embodiment of FIG. 5, the compression is either preformed by the compiler software prior to run-time execution or by the firmware or software running on either the embedded MPU 400 of FIG. 1, or the external or embedded MPU 400 of FIG. 2 or FIG. 3. In addition, the embodiment of FIG. 5 operates similar to the internal units as illustrated and documented in FIG. 3 without the need for hardware compression. The directory and compression directives are embedded by the user software at compilation time. The Compression Control Block 300 is simplified and is now only required to perform the control for the decompression and/or bypass operation as previously defined.

Figure 6:
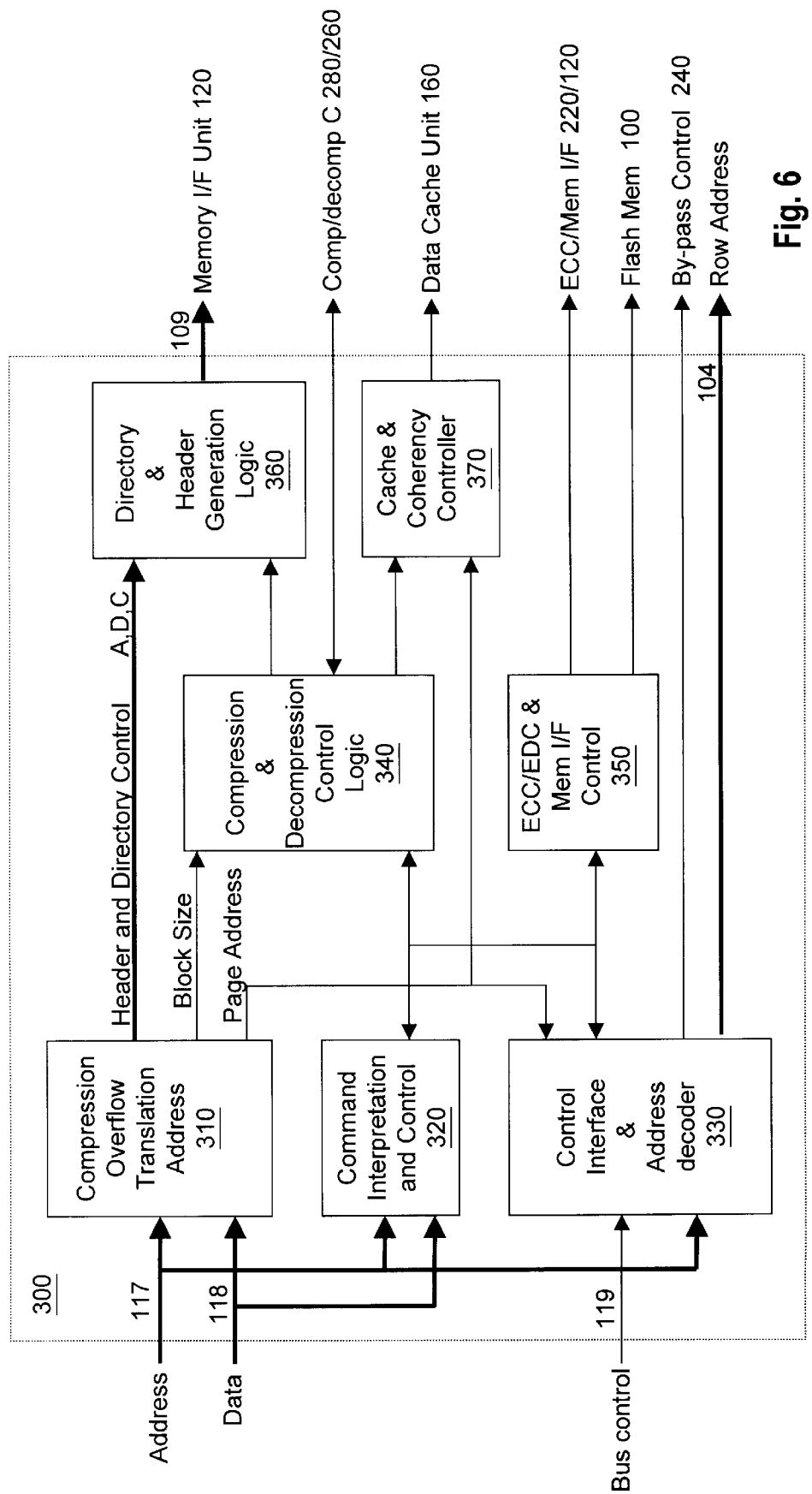
FIG. 6 is a detailed block diagram illustrating the internal architecture of the control logic embedded within the Compression Enhanced Flash Memory Controller (CEFMC) invention.

The compression control unit 300 controls the operation of the compression, decompression, bypass and memory control functions of the present invention. FIG. 6 indicates a control block that can be used for any of the embodiments disclosed. Note that in some cases elements of the compression controller 300 are not needed. The address, data, and control interface may enter into multiple internal logic units in compression controller 300. The compression overflow and translation unit 310 performs the allocation of compression addresses and overflow memory allocation. This unit couples to the Directory and Header Generation Logic 360 which generates header and packet information for the Flash Memory Interface Unit 120. The Compression Overflow and Translation Address unit 310 also determines the compression block size and the memory page address. The Compression block size information is coupled to the Compression and Decompression Control logic 340 for eventual control of the compression and decompression engine operation. Also, the Command Interpretation and Control unit 320 interfaces to the System Bus 118. This unit traps instructions from the embedded MPU 140 or external MPU 400 when indicated by either a specific address or by conditions on the Bus Control 119 inputs from the System Bus 118. Instructions are decoded by the Command Interpreter 320 for control and process flows indicated in FIGS. 7 & 8. The Command Interpretation and Control unit 320 couples to the Compression and Decompression Control logic unit 340, the Control Interface Address Decoder 330 and the ECC/EDC Memory control unit 350. Commands are sent to each of these units to control other units within the CEFMC 200 and/or CEMC 910 of the present invention. Additionally, the Control Interface Address Decoder Unit 330 also may couple to the System Bus 118 to decode address ranges for proper command, operation and control. This unit couples to the Compression Translation Address logic 310, the Command Interpretation unit 320, and the Bypass Logic 240, and performs the Row address 104 calculation for the Flash Memory Array 100. The Control Interface unit 330 receives the page address from the Translation Table unit in the Compression Overflow and Translation Address generator 310 to determine the correct address required in the Flash Memory Array 100. Error Correction and Memory Control unit 350 performs the required control for both the ECC/EDC byte multiplexer 220 and the Flash Memory Interface Unit 120 and may include some control information for the Flash Memory Array 100. The Directory and Header Generation logic 360 couples to the Compression Overflow and Address Translation unit 310 and the Compression/Decompression Control logic 340 and performs the generation of the header data and controls the insertion by the header data into the compressed data stream at the Memory Interface unit 120 via Control Bus 109. Header data is defined as the information needed to describe to the decompression engine specific information during the decompression process to decompress the data of the present compression block. In the embodiment where Compression Cache 425 memory is used for data storage buffers for de-coupling of decompression data from the system interface 118, the Cache and Coherency Controller 370 may be required. The Cache and Coherency Controller 370 couples to the compression/decompression Control logic 340, the compression overflow unit 310, and the Compression Cache Memory 160 for generation and notification for Compression Cache control. This unit 370 may contain tag address tables for cache hit/miss information and may also contain other logic necessary to control the system coherency.

Figure 7:
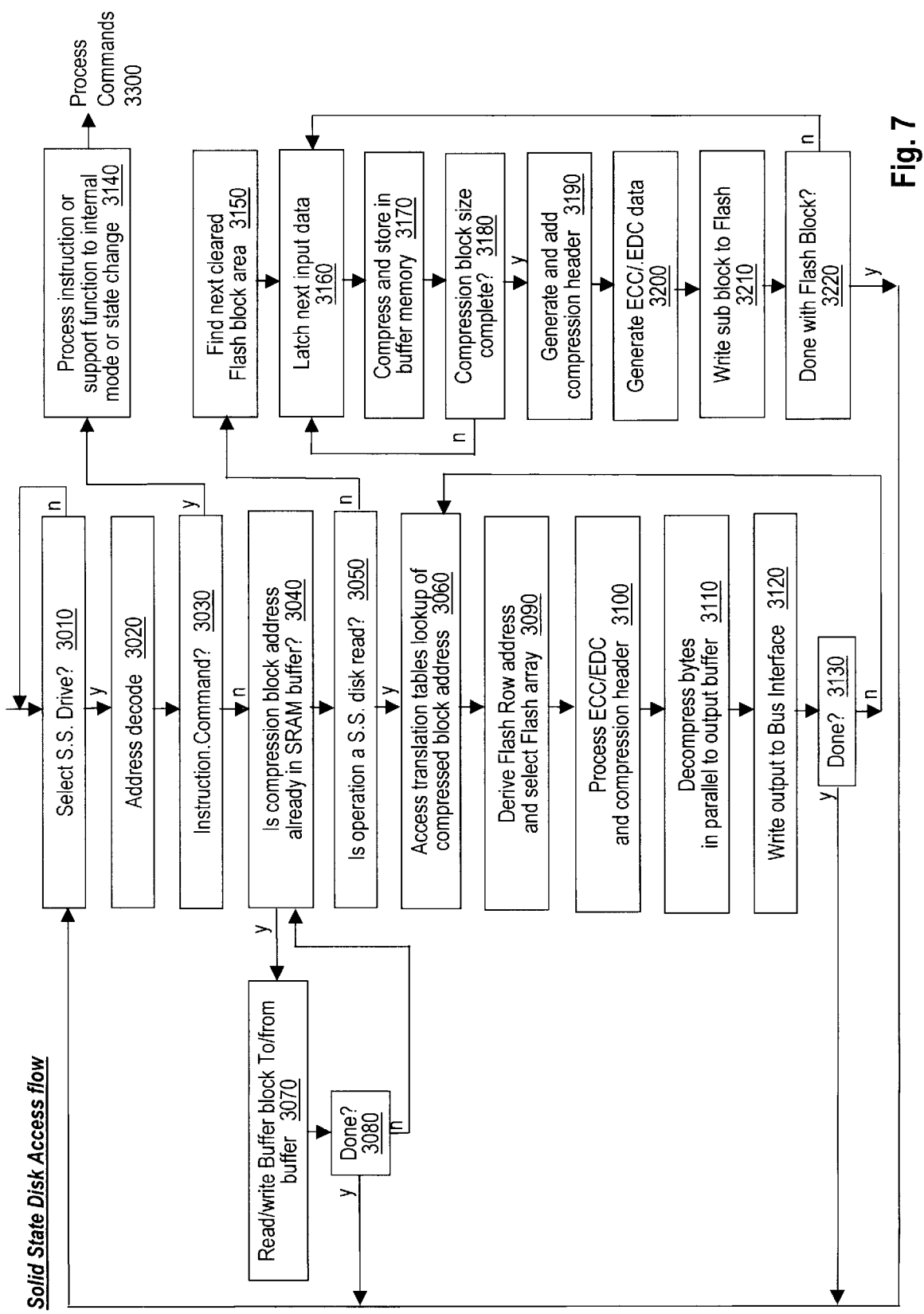
FIG. 7 shows the compression block read and write process flow for the solid state disk embodiment of the Compression Enhanced Flash Memory Controller invention.

The access flow diagram for the solid-state disk embodiment 10 illustrated in FIG. 7. This flow-chart describes the CEFMC operation of the preferred embodiment 10 illustrated in FIGS. 3 and 6. FIG. 7 shows the process for read access and write access, to/from the Flash Memory System 900. The flow diagram of FIG. 7 is for data that resides either in the SRAM Buffer 160 or in the Flash Memory Array 100. In the first step of FIG. 7, access to the solid state disk drive 900 must be established as indicated in block 3010. If the correct System Bus 118 address and control are present, the initial decoder indicates the initiation of an access cycle. After selection, an address decode is performed in block 3020. If not, the flash disk system 900 continues to wait for the next select cycle indicated on the System Bus 118. After the address for the flash disk system 900 is decoded, it is possible to determine if the disk access request is a "control instruction" or "command" indicated in step 3030. If the address decode step 3020 indicates a "command" then the process proceeds to block 3140 where the command is interpreted and written to the appropriate control register for execution. If not a command or instruction, the flow proceeds with step 3040 to determine if the requested address has already been decompressed with the access data currently valid and stored in the Data Buffer 160. If the requested access address indicates a valid "hit" in the data buffer the process proceeds with step 3070. Step 3070 determines if the operation is a read or a write to/from the Data Buffer 160. In step 3070 any cache or buffer maintenance to indicate the last transaction is also performed. As indicated in 3080, this process continues until the entire requested operation is completed. If at any time the transaction address does not represent data in the range of the Data Buffer 160, then the flow continues with step 3050, where a determination of flash memory access vs. flash memory storage is required. Assuming the general case in 3050 which is a read access of the Flash Memory Array 100, the flow continues with step 3060. The CEFMC Compression Control unit 300 now determines the access translation address by translating the System Bus 118 address into the compression block address. The flow continues with the derivation of the Flash Memory Array 100 row address and compressed data access indicated in step 3090. Accessed data from the Flash Memory Array 100 is then transferred to the ECC/EDC block 220 by the Flash Memory Interface Unit 120. The process of step 3100 is to error correct and/or error detect the incoming compressed data stream. Also in step 3100 is the compression header extraction operation to determine the proper control states for the decompression engine 280. In the header extraction process, the Flash Memory Interface 120 passes the compressed data header to the Compression Control unit 300, and the Compression Control unit 300 then extracts information from the header for use in the following decompression process. In Step 3110 the Decompression Engine 280 decompresses the error corrected compressed data under control of the Compression Control unit 300. Once the data is in decompressed format, it is written to the Data Buffer 160 and on to the System Bus Interface unit 180 for timing and synchronization to the System Bus 118 protocol requirements. A check is made in step 15; 3130 to see if additional blocks are required to complete the entire read transaction. If so, the process proceeds with step 3060 to begin the address translation for the next compressed block read. If the entire access transition is complete, the process idles in step 3010 awaiting the next transaction request from the System Bus 118.

Referring to step 3050 again, if the transaction is a solid state disk write request, the process continues in step 3150. It is assumed that data must be compressed into the Flash Memory Array 100. Step 3150 must determine if any blocks of the Flash Memory Array 100 are cleared and ready for the write data. Not shown in this flow diagram is the process for clearing Flash Memory Array 100 blocks for storage of data pages onto the Flash Disk System 900. After identification of the open flash block, a reallocation of the block address, and if necessary, a de-allocation of the old block address, the CEFMC 200 is ready to proceed to step 3160. It is assumed that the input write data is latched into the Compression Engine 260 under control of the Compression Control unit 300. Step 3170 then starts the compression process as the Compression Control unit 300 develops the compression header and assigns a translation address for storage of the compressed block into the Flash Memory Array 100. Typically, multiple compression blocks make up one data page of storage. In step 3180 the Compression Control unit 300 continues to latch data and compress data (steps 3160 & 3170) until the compression block has been completed. Step 3180 determines if a new compression block needs to be started, and, if so, continues to step 3190 where the compression block header is built with specific information about the compression block. In step 3200 the ECC data is calculated and combined with the compressed data and sent along with the compression block header data to be merged in the Flash Memory Interface and byte multiplex unit 120. The final compressed block with header and error correction information is then written to the Flash Memory Array 100 in step 3210. This process continues in step 3220 until all the entire page of data from the System Bus 118 has been compressed and stored into the Flash Memory Array 100. The flow of FIG. 7 assumes that only page transfer read and writes are performed. Not indicated is the operation for partial block access or specific partial block writes. This operation is discussed in some detail in the XIP flow of FIG. 8.

Figure 8:
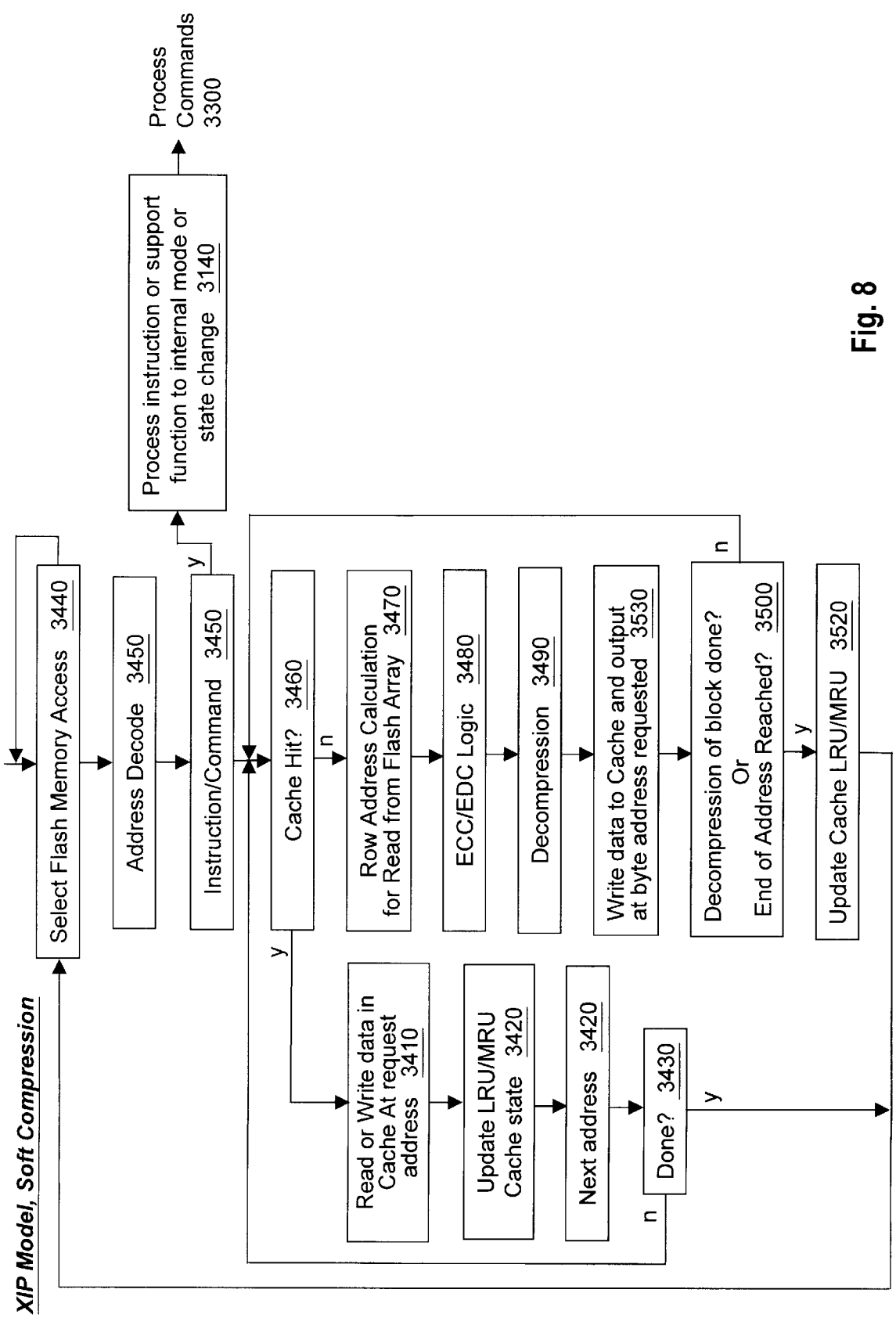
FIG. 8 illustrates the process flow for Execute In Place (XIP) mode of operation for the Compression Enhanced Flash Memory Controller invention.

The preferred read transaction flow for the CEFMC 200 is shown in FIG. 8. FIG. 8 indicates the preferred process flow for the embodiment as indicated in FIG. 5 of the present invention. This XIP model assumes that software compression of the data is preformed at compilation time, and a compressed image is written into Flash Memory Array 100 prior to run-time operation. In this "mostly read-only" model instructions and data are read directly from the Flash System 900, and any data modification is kept during operation in either the Main Memory 440 or dedicated MPU Memory 420. Starting with the access selection from the System Bus 118 to the CEFMC 200 in step 3440, the flash controller stays in idle until the proper state of the System Bus 118 indicates a transaction to the Flash Memory Array 100. If selected, an address decode process in step 3450 determines the type of operation required by the System Bus 118 or system MPU 400. Step 3450 determines if the transaction is an instruction or command to the CEFMC 200 for internal control. If a command, the process continues with step 3140 to process the command or control operation. If not a command, the process continues with a determination if the address for transaction has data that is currently valid in the Compression Cache 425, thus in step 3460 a cache hit or miss is determined. If a Compression Cache hit is determined by the Compression Control unit 300, the process continues with step 3410 where a read or write of the cache block or sub-block address is completed. Step 3410 completes the read or write transaction while step 3420 updates the state of the cache controller. A determination is then made to see if more data is required to be read or written during the transaction in step 3420. If the transaction is complete and requires no access of the Flash Memory Array 100, then the process continues to idle in step 3440 waiting on the next transaction. If more data is required to complete the transaction request, then a new cache hit status must again be determined in step 3460.

Assuming a cache miss in step 3460, and the bypass mode is not selected, the Flash Memory Array 100 must be accessed for both read and write data. Step 3470, under control by the Compression Control unit 300, performs the address translation and header block extraction to start the flow of compressed data from the Flash Memory Array 100. As compressed data is read from the Flash Memory Array 100, by the Flash Memory Interface 120 under control by the Compression Control Block 300, the Error Correction and Detection unit 225 in step 3480 processes the compressed data for ECC and EDC. The process continues with the Decompression Engine 280 decompressing the data from the ECC/EDC unit 225 as indicated in step 3490. In step 3530, the decomopressed data is written to the Cache 160 and output to the requested byte address. The process loop of steps 3460 to 3500 continues until a complete compressed block has been decompressed from the Flash Memory Array 100. In step 3500 the Compression Control unit 300 determines if more data to complete the compression block decompression process needs to be read from the Flash Memory Array 100 or if the end of the burst address has been reached. If more data is required the process continues at step 3460 where the cache hit/miss is again determined. If the compression block has been completely decompressed to cache memory and no more blocks are required the process continues by updating the cache LRU/MRU state in step 3520. Once completed this process begins again at step 3440 waiting for the next read access.

Figure 9:
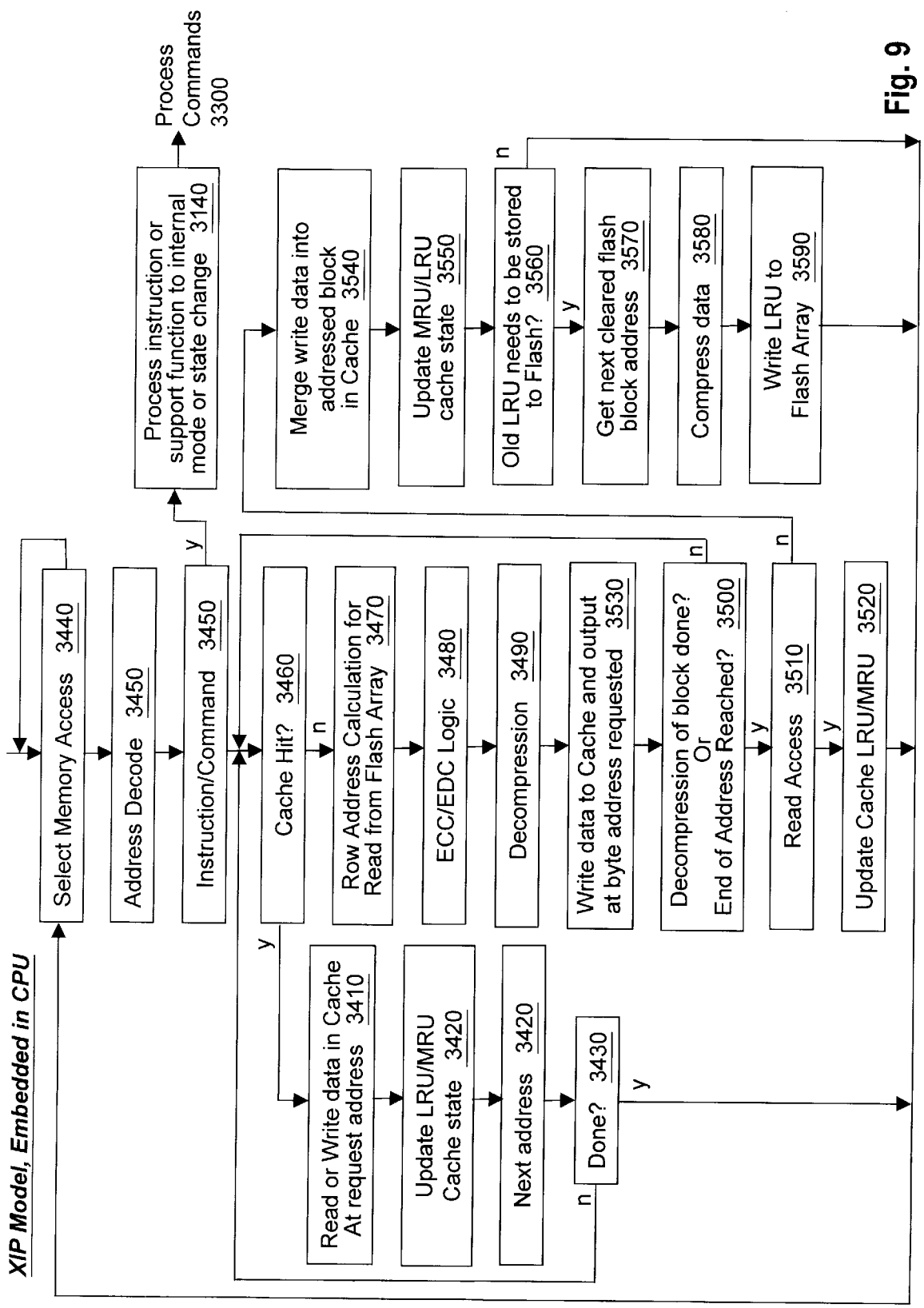
FIG. 9 is the process flow diagram for the Compression Enhanced Memory Controller (CEMC) invention when embedded into the MPU as the system memory controller.

Referring to FIG. 9, the preferred embodiment for the process of the embedded implementation of the present invention is illustrated. This embodiment is illustrated in FIG. 4 wherein the present invention is embedded and serves as the Memory Controller (CEMC) 910 of the MPU 400. The improvement of this embodiment is to allow system data, other than just flash memory, the opportunity to use compression. System data is defined as any data hat is transferred on the System Bus 118 between any of the internal or external components. Again, the high speed low latency parallel compression operation allows the present invention to fit "in-line" with the data flow to and from the Main Memory 440 located on the System Bus 118. In the present embodiment of FIG. 4, the Compression Cache 425 contains uncompressed data and may be similar to prior art cache memory design. The difference between the present embodiment of FIG. 4, and other embodiments is when writing data smaller than the compression block that has been flagged as cache miss data. In such a case data must first be read from Main Memory 440 or Flash Memory System 900, decompressed and merged with the write data. The output write data is stored in cache for use and is re-compressed then written back to memory for storage.

This process flow is outlined in FIG. 9 of the present invention. Starting with the access selection from the System Bus 118 to the CEMC 910 in step 3440, the memory controller 910 stays in idle until the proper state of the System Bus 118 indicates a transaction to the Flash Memory Array 100. If selected, an address decode process in step 3450 determines the type of operation required by the System Bus 118 or system MPU 400. Step 3450 determines if the transaction is an instruction on command to the CEFMC 200 for internal control. If the transaction is an instruction or command, the process continues with step 3140 to process the command or control operation. If not an instruction or command, the process continues by determining if the address for transaction has data that is currently valid in the Compression Cache 425. Thus in step 3460 a cache hit or miss is determined. If a Compression Cache 420 hit is determined by the Compression Control unit 300, the process continues with step 3410 where a read or write of the cache block or sub-block address is completed. Step 3410 completes the read or write transaction while step 3420 updates the state of the cache controller. A determination is then made to see if more data is required to be read or written during the transaction in step 3420. If the transaction is complete and requires no access of the Flash Memory Array 100, then the process continues to idle in step 3440 waiting on the next transaction. If more data is required to complete the transaction request, then a new cache hit status must again be determined in step 3460. Assuming a cache miss in step 3460, and the bypass mode is not selected, the Flash Memory Array must be accessed for both read and write data. Step 3470, under control of the Compression Control unit 300, performs the address translation, and header block extraction to start the flow of compressed data from the Flash Memory Array 100. As compressed data is read from the Flash Memory Array 100 of the Flash memory interface 120 under control by the compression control block 300, the Error Correction and Detection unit 225 in step 3480 processes the compressed data for ECC and EDC. The process continues with the Decompression Engine 280 decompressing the data from the ECC/EDC unit 225 as indicated in step 3490. The process loop of steps 3460 to 3500 continues until a complete compressed block has been decompressed from the Flash Memory Array 100. In step 3500 the Compression Control unit 300 determines if more data is needed to complete the compression block decompression process. If so, more data is read from the Flash Memory Array 100. If not, then the end of the burst address has been reached. If more data is required the process continues at step 3460 where the cache hit/miss is again determined. If the compression block has been completely decompressed to cache memory 425 and no more blocks are required the process continues by updating the cache LRU/MRU state in step 3520. Once completed this process begins again at step 3440 waiting for the next read access. If after the end of block address is reached in step 3500, then in step 3510, if the process is a write, the write data must be merged with read data from the same compression block area. In step 3540 the write data is merged with the previously decompressed read data in the Cache Memory 425. Once the write data is merged, step 3550 updates the LRU/MRU cache state and proceeds to complete the write cycle. In step 3560 if the latest write block forces a write back of the LRU block, then the process continues with step 3570. If not, and open cache blocks were available then the process returns into the idle state of step 3440 and waits for the next transaction request. If LRU data is retired to the Flash Memory System 900, the Flash Memory Controller 200 embedded within the Flash Memory System 900 must return the address of a cleared block of flash memory for write back of the compressed LRU as indicated in step 3570. The retired LRU data may be compressed as indicated in step 3580 and then written back into the Flash Memory Array 100 shown in step 3590. Thus, for increased system performance and lower costs the embedded compression and decompression architecture of the present invention is a substantial improvement from prior art Flash memory controllers.

Now referring to the increased performance aspects of the present invention, the advantages of using compression and decompression within the embedded system are shown. For the present embodiment a good example of the performance and cost advantages can be illustrated using the execute in place application of FIG. 5. Data is clocked out of the Flash Memory Array 100 on a 32-bit bus at 40 ns for every four bytes. This is considered the flash memory "source" rate. The "sink" rate is the maximum System Bus 118 bandwidth running at 66 MHZ, which is equivalent to four bytes every 16 ns. If the average compression ratio for the parallel compression algorithm is 2.5:1 then the output rate of the Flash Memory Array 100 after decompression will be 40/2.5 ns per four bytes read, or 16 ns/Byte thus matching the 66 MHZ maximum bus speed requirements. In addition the effective density of the flash memory is now 2.5 times larger than without the use of the present invention. Thus the use of the present invention can greatly increase the system performance while decreasing the per-bit effective cost of storage.

Parallel Lossless Compression and Decompression

The parallel compression/decompression units or engines 260 and 280, in combination referred to as codec engine 260/280, which perform parallel compression and decompression functions, are now discussed. The codec engine 2601280 is preferably a dedicated codec hardware engine, e.g., the engine is comprised of logic circuitry. In one embodiment, the codec engine 260/280 comprises a programmable DSP or CPU core, or programmable compression/decompression processor, with one or more ROMs or RAMs which store different sets of microcode for certain functions, such as compression, decompression, special types of graphical compression and decompression, and bit blit operations, as desired. In another embodiment, the codec engine 260/280 dynamically shifts between the different sets of microcode in the one or more memories, depending on the function being performed. The compression/decompression engine may also be implemented using reconfigurable or programmable logic, e.g., one or more FPGAs.

As shown in FIGS. 3 and 4, in some embodiments, the engine 260/280 preferably includes a lossless parallel data compression engine 260 and parallel decompression engine 280 designed to compress and decompress data as data is transferred to/from flash memory. Other embodiments, as illustrated in FIG. 5, may be implemented with only a decompression engine 280. The compression engine 260 and decompression engine 280 may be constructed using any of the techniques described with reference to the engine 260/280, including hardware engines comprised of logic circuitry, programmable CPUs, DSPs, a dedicated compression/decompression processor, or reconfigurable or programmable logic, to perform the parallel compression and decompression method of the present invention. Various other implementations may be used to embed a compression/decompression within the flash memory controller according to the present invention. In one embodiment, the compression engine 260 and decompression engine 280 comprise hardware engines in the CEFMC 200 as shown in FIG. 3. In another embodiment, the compression engine 260 and decompression engine 280 comprise hardware engines in the CEMC 910 as shown in FIG. 4. In yet another embodiment, the decompression engine 280 comprises a hardware engine in the CEFMC 200 as shown in FIG. 5, In the following description, the parallel compression and decompression unit is described as having separate compression and decompression engines 260 and 280.

In the various embodiments, the compression engine 260 and decompression engine 280 comprise one or more hardware engines that perform a novel parallel lossless compression method, preferably a "parallel" dictionary based compression and decompression algorithm. The parallel algorithm may be based on a serial dictionary based algorithm, such as the LZ77 (preferably LZSS) dictionary based compression and decompression algorithm. The parallel algorithm may be based on any variation of conventional serial LZ compression, including LZ77, LZ78, LZW and/or LZRW1, among others, The parallel algorithm could also be based on Run length Encoding, Predictive Encoding, Huffman, Arithmetic, or any other lossless compression algorithm. However, the paralleling of these is less preferred due to their lower compression capabilities and/or higher hardware costs.

As a base technology, any of various lossless compression methods may be used as desired. As noted above, a parallel implementation of LZSS compression is preferably used, although other lossless compression methods may allow for fast parallel compression and decompression specifically designed for the purpose of improved memory bandwidth and efficiency.

Figure 10A:
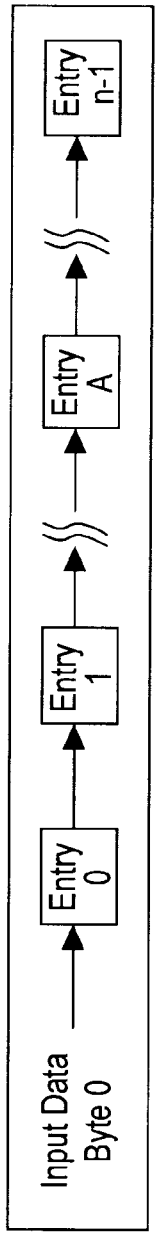
FIG. 10A illustrates the sequential compression technique of the prior art dictionary-based LZ serial compression algorithm.

FIG. 10A—Prior Art, Serial LZ Compression

Prior art has made use of the LZ compression algorithm for design of computer hardware, but the bandwidth of the data stream has been limited due to the need to serially review the incoming data to properly generate the compressed output stream. FIG. 10A depicts the prior art normal history table implementation.

The LZ compression algorithm attempts to reduce the number of bits required to store data by scarching that data for repeated symbols or groups of symbols. A hardware implementation of an LZ77 algorithm would make use of a history table to remember the last n symbols of a data stream so that they could be compared with the incoming data. When a match is found between the incoming stream and the history table, the matching symbols from the stream are replaced by a compressed symbol, which describes how to recover the symbols from the history table.

Figure 10B:
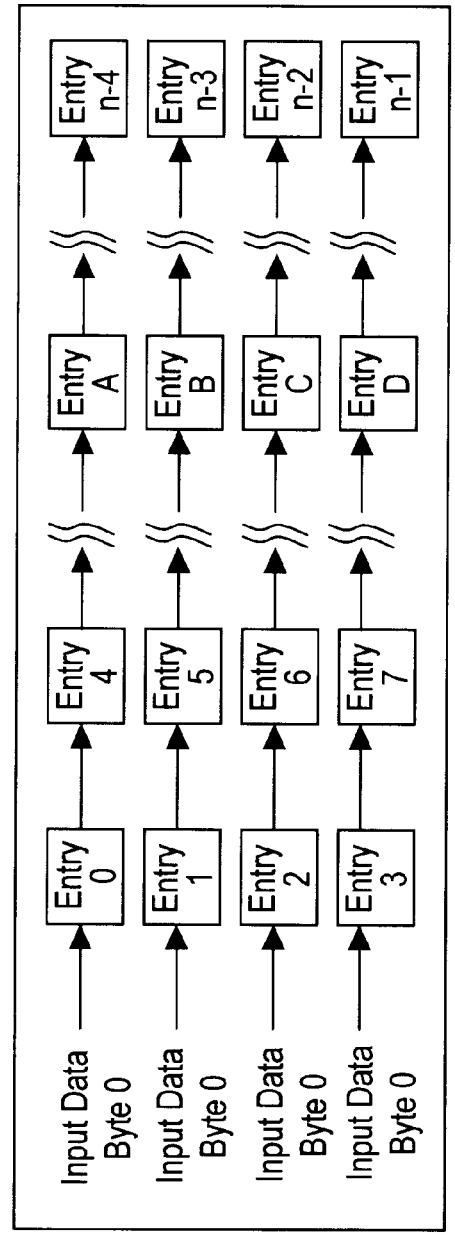
FIG. 10B illustrates the parallel compression algorithm according to the present invention.

FIG. 10B—Parallel Algorithm

The preferred embodiment of the present invention provides a parallel implementation of dictionary based (or history table based) compression/decompression. By designing a parallel history table, and the associated compare logic, the bandwidth of the compression algorithm can be increased many times. This specification describes the implementation of a 4 symbol parallel algorithm which results in a 4 times improvement in the bandwidth of the implementation with no reduction in the compression ratio of the data. In alternate embodiments, the number of symbols and parallel history table can be increased and scaled beyond four for improved parallel operation and bandwidth, or reduced to ease the hardware circuit requirements. In general, the parallel compression algorithm can be a 2 symbol parallel algorithm or greater, and is preferably a multiple of 2, e.g., 2, 4, 8, 16, 32, etc. The parallel algorithm is described below with reference to a 4 symbol parallel algorithm for illustrative purposes.

The parallel algorithm comprises paralleling three parts of the serial algorithm: the history table (or history window), analysis of symbols and compressed stream selection, and the output generation. In the preferred embodiment the data-flow through the history table becomes a 4 symbol parallel flow instead of a single symbol history table. Also, 4 symbols are analyzed in parallel, and multiple compressed outputs may also be provided in parallel. Other alternate embodiments may contain a plurality of compression windows for decompression of multiple streams, allowing a context switch between decompression of individual data blocks. Such alternate embodiments may increase the cost and gate counts with the advantage of suspending current block decompression in favor of other block decompression to reduce latency during fetch operations. For case of discussion, this disclosure will assume a symbol to be a byte of data. Symbols can be any reasonable size as required by the implementation. FIG. 10B shows the data-flow for the parallel history table.

Figure 11:
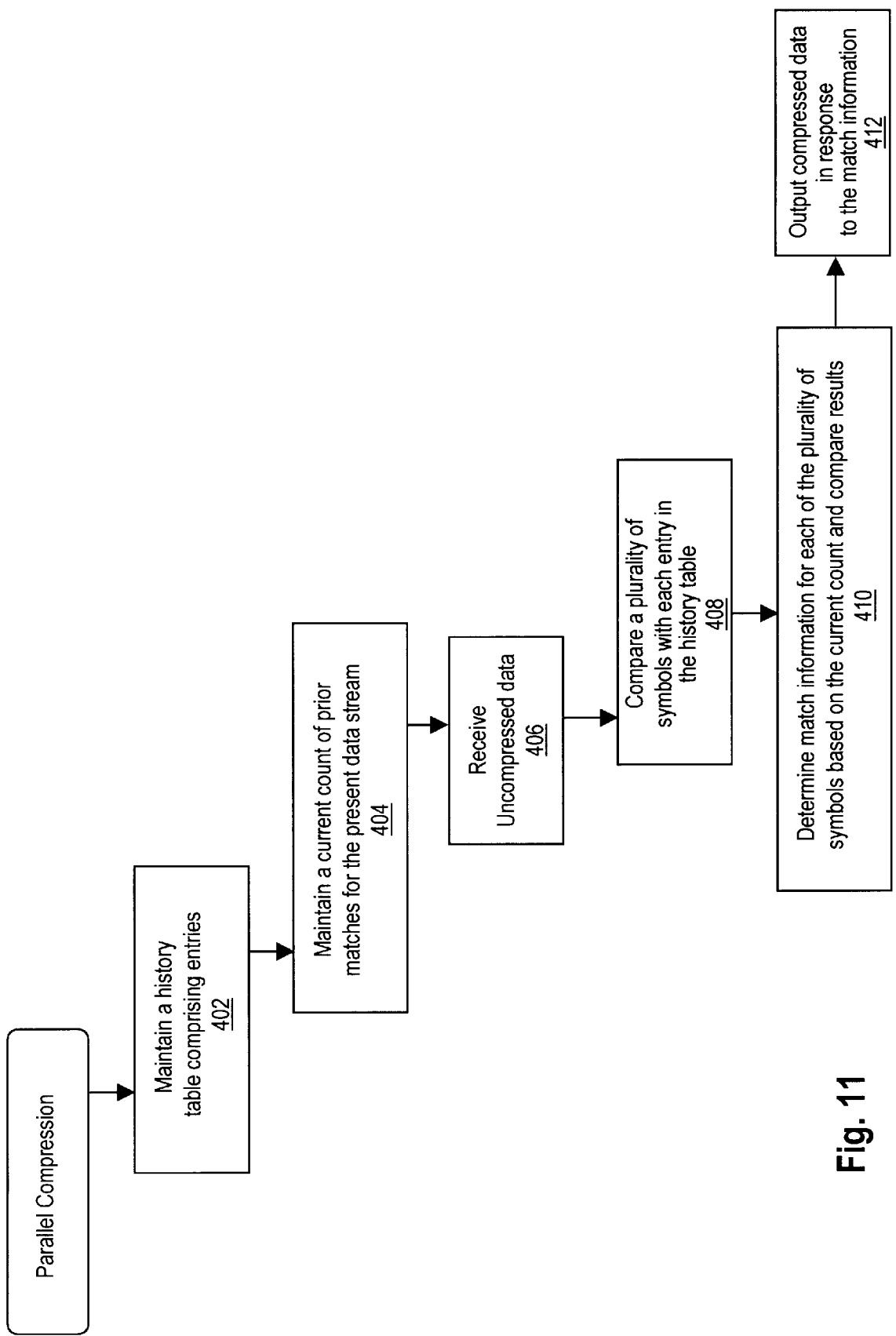
FIG. 11 is a high-level flowchart diagram illustrating operation of the parallel compression.

FIG. 11—High Level Flowchart of the Parallel Compression Algorithm

FIG. 11 is a high-level flowchart diagram illustrating operation of the parallel compression algorithm in the preferred embodiment. Steps in the flowchart may occur concurrently or in different orders.

In step 402 the method maintains a history table (also called a history window) comprising entries, wherein each entry may comprise one symbol. The history table is preferably a sliding window which stores the last n symbols of the data stream.

In step 404 the method maintains a current count of prior matches which occurred when previous symbols were compared with entries in the history table, A count is maintained for each entry in the history table.

It is noted that maintenance of the history table and the current counts are performed throughout the algorithm based on previously received symbols, preferably starting when the first plurality of symbols are received for compression.

In step 406 the method receives uncompressed data, wherein the uncompressed data comprises a plurality of symbols. Thus the parallel compression algorithm operates on a plurality of symbols at a time. This is different than conventional prior art serial algorithms, which operate in a serial manner on only one symbol at a time. The plurality of symbols comprises 2 or more symbols, preferably a power of 2. In the preferred embodiment, the parallel compression algorithm operates on 4 symbols at a time. However, implementations using 8, 16, 32 or more symbols, as well as other non-power of 2 numbers, may be readily accomplished using the algorithm described herein.

In step 408 the method compares the plurality of symbols with each entry in the history table in a parallel fashion. This comparison produces compare results. Each entry in the history table preferably compares with each of the plurality of symbols concurrently, i.e., in a parallel fashion, for improved speed.

In step 410 the method determines match information for each of the plurality of symbols based on the current count and the compare results. Step 410 of determining match information includes determining zero or more matches of the plurality of symbols with each entry in the history table. More specifically, step 410 may include determining a longest contiguous match based on the current count and the compare results, and then determining if the longest contiguous match has stopped matching. If the longest contiguous match has stopped matching, then the method resets or updates the current counts.

As noted above, stop 410 also includes resetting the counts for all entries if the compare results indicate a contiguous match did not match one of the plurality of symbols. The counts for all entries are preferably reset based on the number of the plurality of symbols that did not match in the contiguous match. In the preferred embodiment, the method generates a reset value for all entries based on the compare results for a contiguous match. The reset value indicates a number of the plurality of symbols that did not match in the contiguous match as indicated in the compare results. The method then updates the current counts according to the compare results and the reset value.

In step 412 the method outputs compressed data information in response to the match information. Step 412 may involve outputting a plurality of sets or compressed data information in parallel, e.g., for different matches and/or for non-matching symbols. Step 412 includes outputting compressed data information corresponding to the longest contiguous match that stopped matching, if any. The contiguous match may involve a match from a prior plurality of symbols. Step 412 may also include outputting compressed data information solely from a prior match. Step 412 also includes, for non-matching symbols that do not match any entry in the history table, outputting the non-matching symbols in an uncompressed format.

For a contiguous match, the compressed data information includes a count value and an entry pointer. The entry pointer points to the entry in the history table that produced the contiguous match, and the count value indicates a number of matching symbols in the contiguous match. In one embodiment, an encoded value is output as the count value, wherein more often occurring counts are encoded with fewer bits than less often occurring counts.

Steps 402–412 are repeated one or more times until no more data is available. When no more data is available, then, if any current counts air, non-zero, the method outputs compressed data for the longest remaining match in the history table.

Since the method performs parallel compression, operating on a plurality of symbols at a time, the method preferably accounts for symbol snatches comprised entirely within a given plurality of symbols, referred to as the "special case". Here presume that the plurality of symbols includes a first symbol, a last symbol, and one or more middle symbols. Step 410 of determining match information includes detecting if at least one contiguous match occurs with one or more respective contiguous middle symbols, and the one or more respective contiguous middle symbols are not involved in a match with either the symbol before or after the respective contiguous middle symbols. If this condition is detected, then the method selects the one or more largest non-overlapping contiguous matches involving the middle symbols. In this instance, step 412 includes outputting compressed data for each of the selected matches involving the middle symbols.

Figure 12:
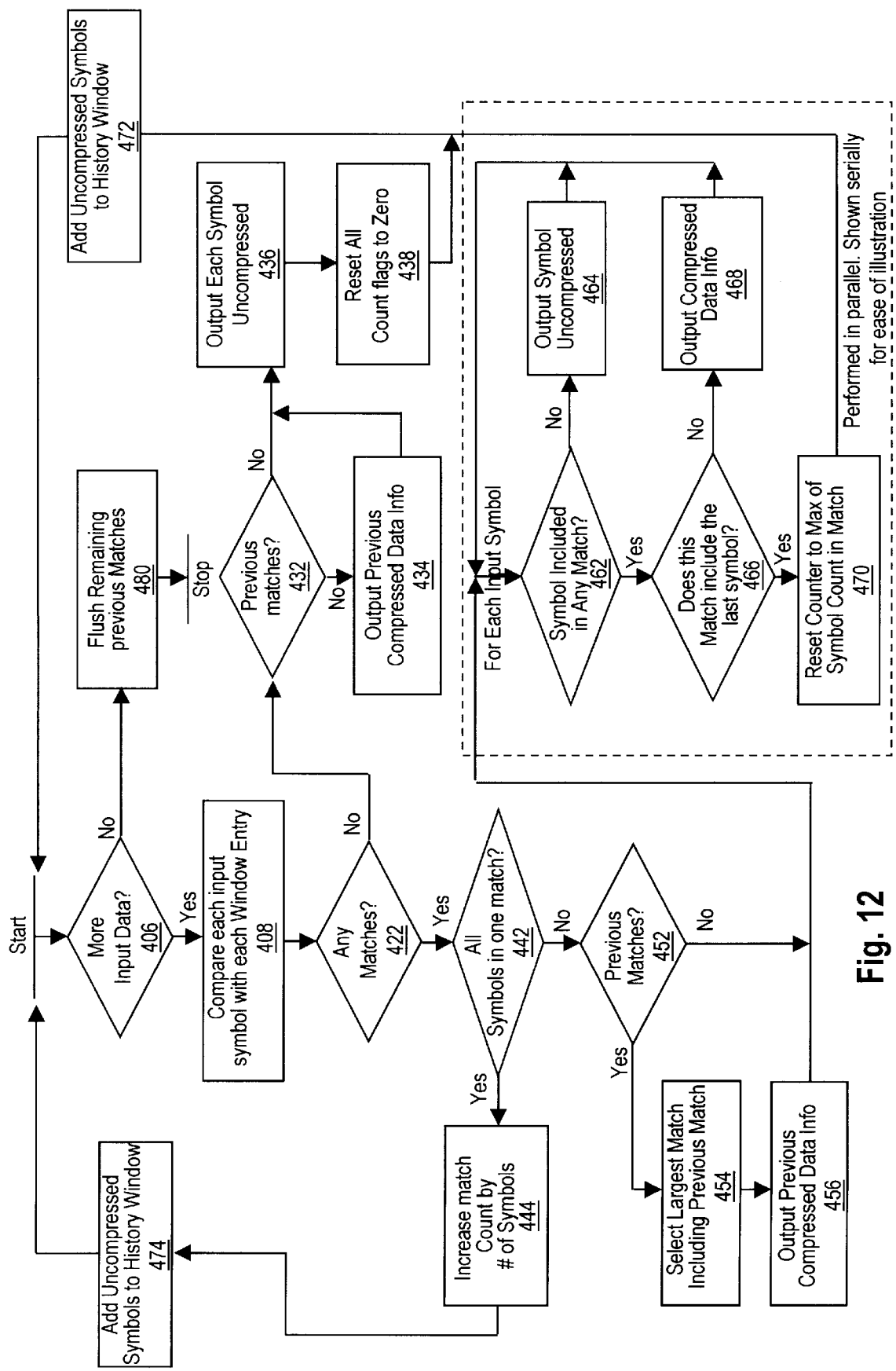
FIG. 12 is a more detailed flowchart diagram illustrating operation of the parallel compression.

FIG. 12—Detailed Flowchart of the Parallel Compression Algorithm

FIG. 12 is a more detailed flowchart diagram illustrating operation of the parallel compression algorithm in the preferred embodiment. Steps which are similar or identical to steps in FIG. 11 have the same reference numerals for convenience.

In the flowchart of FIG. 12, it is presumed that the method maintains a history table comprising entries, wherein each entry comprises one symbol. The history table is preferably a sliding window which stores the last n symbols of the data stream. It is also presumed that the method maintains a current count of prior matches that occurred when previous symbols were compared with entries in the history table. A count is maintained for each entry in the history table. As noted above, the maintenance of the history table arid the current counts are performed throughout the algorithm, preferably stating when the first plurality or symbols are received for compression.

In step 406 the method receives uncompressed input data, wherein the uncompressed data comprises a plurality (or group) of symbols. Thus the parallel compression algorithm operates on a plurality of symbols at a time. This is different than conventional prior art algorithms, which operate in a serial manner on only one symbol at a time. The plurality of symbols comprises 2 or more symbols, preferably 4 symbols. As noted above, the parallel compression algorithm can operate on any number of symbols at a time. The input data may be the first group of symbols from a data stream or a group of symbols from the middle or end of the data stream.

In step 408 the method compares the plurality of symbols with each entry in the history table in a parallel fashion. This comparison produces compare results. Each entry in the history table preferably compares with each of the plurality of symbols concurrently, i,e., in a parallel fashion, for improved speed.

In step 422 the method determines zero or more matches or the plurality of symbols with each entry in the history table. In other words, in step 422 the method determines, for each entry, whether the entry matched any of the plurality of symbols. This determination is based on the compare results.

If no matches are detected for the plurality of symbols in step 422, then in step 432 the method determines if any previous matches existed. In other words, step 432 determines if one or more ending symbols form the prior group of symbols matched entries in the history table, and compressed information was not yet output for these symbols since the method was waiting for the new plurality of symbols to possibly determine a longer contiguous match. If one or more previous matches existed as determined in step 432, then in step 434 the method outputs the previous compressed data information. In this case, since the prior matches from the prior group of symbols are not contiguous with any symbols in the current group, the previous compressed data information is output. After step 434, operation proceeds to step 436.

If no previous matches existed as determined in step 432, or after step 434, then in step 436 the method outputs each symbol of the plurality of symbols as uncompressed symbols. Since each of the plurality of symbols does not match any entry in the history table, then each of the plurality of symbols are output in an uncompressed format. After step 436, in step 438 all counters are reset to 0. In step 472 the uncompressed symbols are added to the history window, and operation returns to step 406 to receive more input data, i.e., more input symbols.

If one or more matches are detected for the plurality of symbols in step 422, then in step 442 the method determines if all of the plurality of symbols are comprised in one match. If so, then in step 444 the method increases the count for the respective entry by the number of matching symbols, e.g., 4 symbols. In step 474 the uncompressed symbols are added to the history window, and operation returns to step 406 to receive more input data, i.e., more input symbols. In this case, the method defers providing any output information in order to wait and determine if any symbols in the next group contiguously match with the current matching symbols.

If all or the plurality of symbols are not comprised in one match as determined in step 442, then in step 452 the method determines if any previous matches existed. The determination in step 452 is similar to the determination in step 432, and involves determining if one or more ending symbols from the prior group of symbols matched entries in the history table, and compressed information was not yet output for these symbols since the method was waiting for the new plurality of symbols to possibly determine a longer contiguous match.

If one or more previous matches existed as determined in step 452, then in step 454 the method selects the largest contiguous match including the previous match. In step 456 the method outputs compressed data information regarding the largest contiguous match. This compressed data information will include previous compressed data information, since it at least partly involves a previous match from the previous group of symbols. If the first symbol in the current plurality of symbols is not a contiguous match with the previous match, then the compressed data information will comprise only the previous compressed data information. After step 456, operation proceeds to step 462.

Steps 462–470 are performed for each input symbol in a parallel fashion, In other words, steps 462–470 ale performed concurrently for each input symbol, Steps 462–470 are shown in a serial format for ease of illustration.

In stop 462 the method determines if the respective symbol is included in any match. If not, then in step 464 the method outputs the uncompressed symbol. In this case, the respective symbol does not match any entry in the history table, and thus the symbol is output uncompressed.

If the respective symbol is included in a match as determined in step 462, then in step 466 the method determines if the match includes the last symbol. If not, then in step 468 the method outputs compressed data information for the match. It is noted that this may involve a "special case" involving a match comprising only one or more middle symbols.

If the match does include the last symbol as determined in step 466, then in step 470 the method resets counters to the maximum of the symbol count in the match. In this case, compressed information is not output for these symbols since the method waits for the new plurality of symbols to possibly determine a longer contiguous match.

Once steps 462–470 are performed for each input symbol in parallel, then in step 472 the uncompressed symbols are added to the history window. Operation then returns to step 406 to receive more input data, i.e., a new plurality or group of input symbols. If no more input data is available or is received, then in stop 480 the method flushes the remaining previous matches, i.e., provides compressed information for any remaining previous matches.

The method of FIG. 12 also accounts for matches within the middle symbols as described above.

Figure 13:
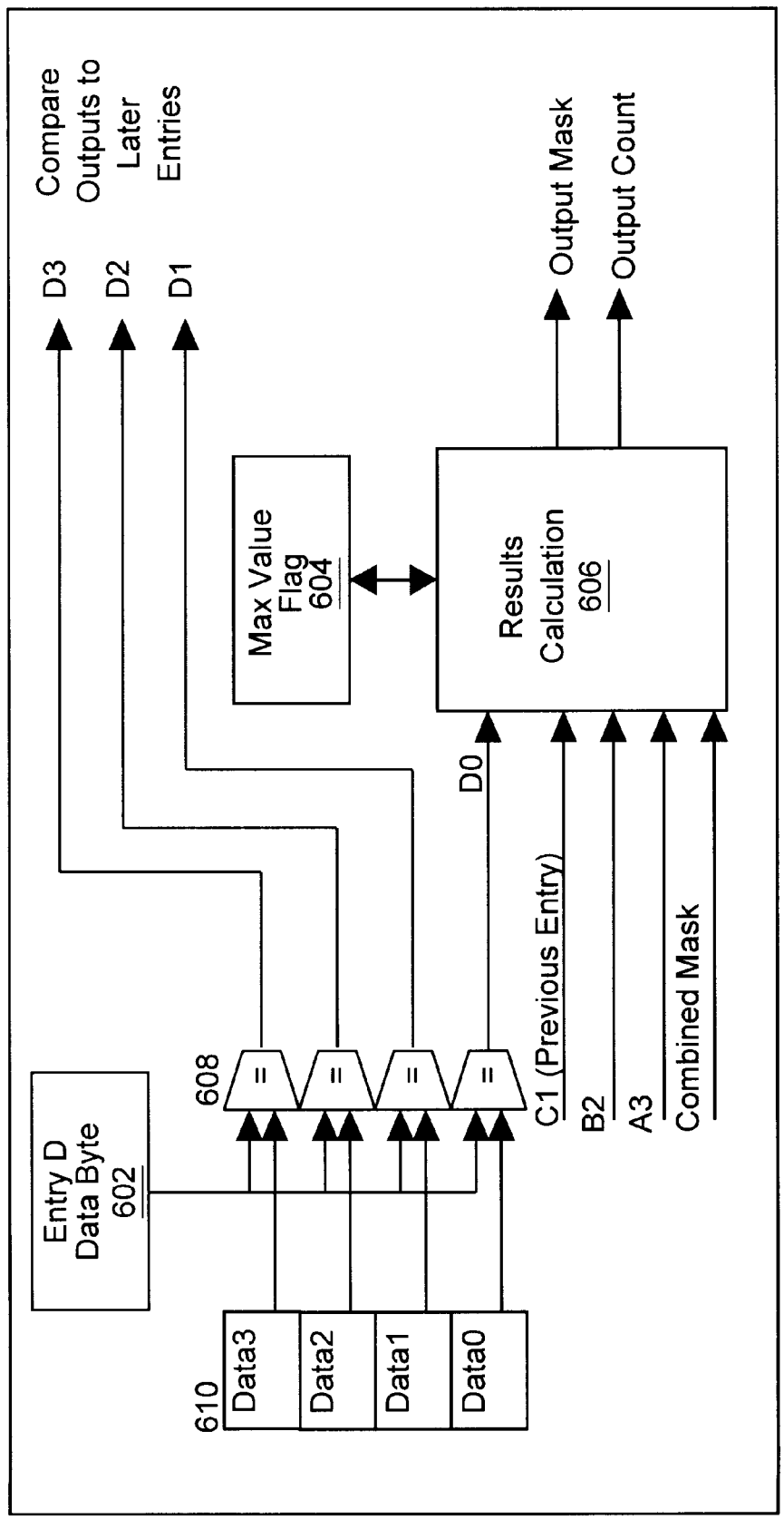
FIG. 13 illustrates the entry data history and input data compare and results calculation for the parallel compression and decompression unit.
Figure 14:
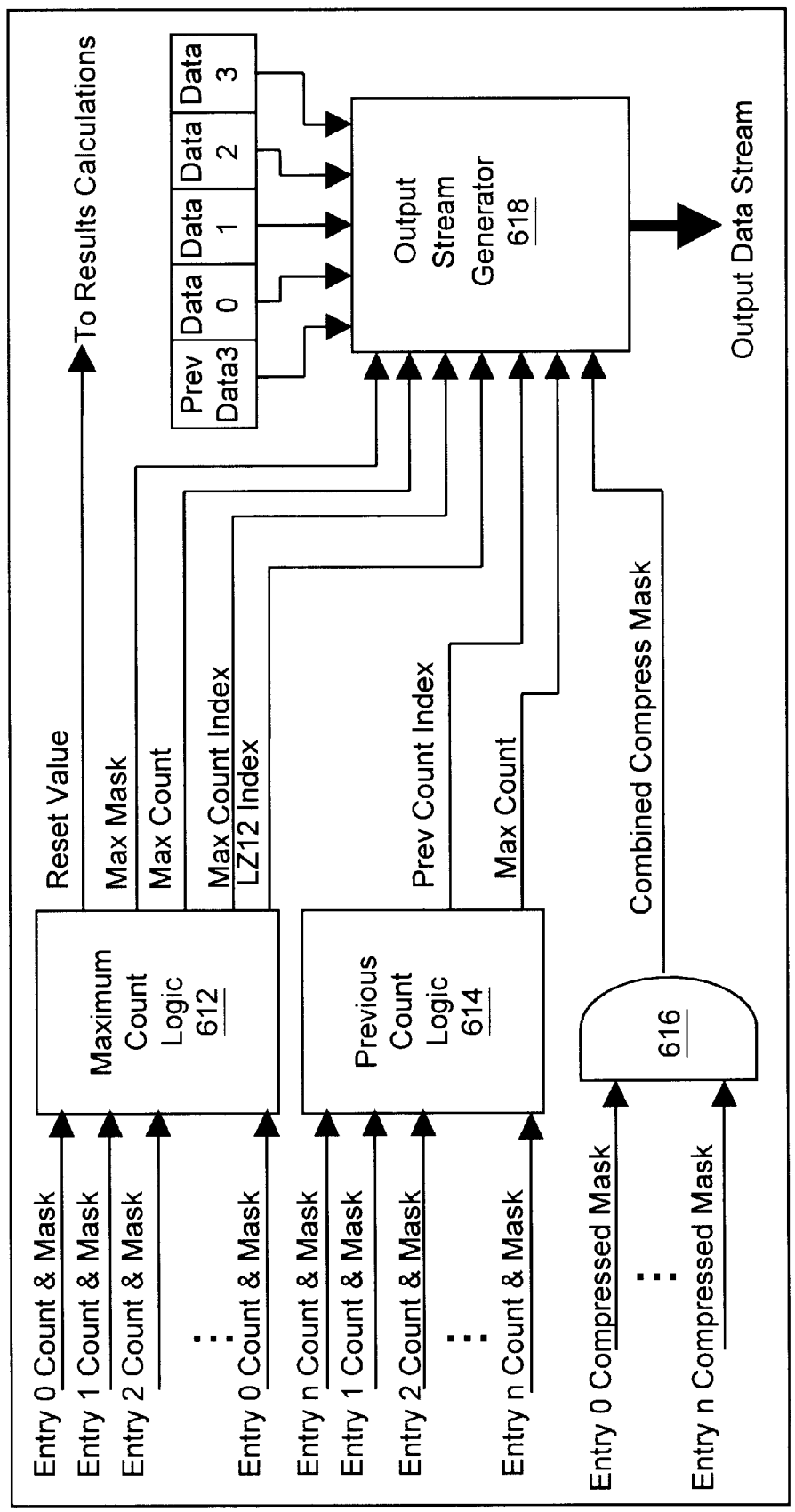
FIG. 14 shows the parallel selection and output generation block diagram.

FIGS. 13 and 14—Operation of the Parallel Compression Algorithm

FIGS. 13 and 14 are hardware diagrams illustrating operation of the parallel compression algorithm. As with the prior art LZ serial algorithm, each entry of the history table contains a symbol (byte) of data, which is compared with the input stream of data 610. The input stream 610 comprises Data0, Data1, Data2 and Data3. FIG. 13 illustrates an entry of the history table, referred to as entry D 602. As shown entry D 602 is compared with each symbol of the input stream 610. FIG. 13 illustrates Entry D 602 of the parallel implementation, and its inputs and outputs. Comparators 608 compare each data byte entry with the 4 bytes from the input stream 610, and generate 4 compare signals (labeled D0 through D3 for entry D). Compare signal D0 is used in entry D. The compare signal D1 will be used by the next entry E in the history table, compare signal D2 will be used by entry F, and compare signal D3 will be used by entry G. Accordingly, entry D uses compare signal 3 from entry A, 2 from compare signal entry B and code 1 from entry C. These can be seen as inputs to the results calculation block 606 in FIG. 13. The results of this compare are held in a counter 604 that is part of the entry logic. The counter values are sent to the compressed stream selection logic 612/614/616 (FIG. 14) to determine if the input data is being compressed or not. This information is forwarded to the output generation logic 618 which sends either the uncompressed data to the output, or the compressed stream data.

The generation of the Output Mask and Output count from the results calculation block 606, along with the Entry Counter update value, is described in the table of FIG. 15. The New Counter Value is calculated by counting the number of matches that occur beginning with A3 and continuing to D0. For example, an A3 and B2 match without a C1 match sets the counter to 2. The special case of all four compares matching adds 4 to the present counter value.

Generation of the counter output is similar, comprising the Saved counter (counter value prior to the setting of the new counter value) plus the count of matches starting with D0 and continuing to A3. The output mask is generated by inverting the 4 match signals and adding a $5^{th}$ signal which is 1 for all cases except for a special case of a C1 and B2 FIG. match without a D0 or an A3 match. This special case allows the compression of the two bytes centered in the input word. The Reset Value will be generated by the selection logic 612 from the mask value. The reset value is included in this disclosure as indicated in the table of FIG. 15 for case of description only.

Compressed Stream Selection Logic

FIG. 14 shows a block diagram of the selection logic 612/614/616 and the output stream generation logic 618. The compressed stream selection logic 612/614/616 collects the output counters and the output masks from each of the entries from the results calculation block 606, and generates indices and counts for the output stream generator 618, along with the Reset Value which is sent back to each entry. The indices point to the entries that generated the selected counts. The main function of the Selection Logic 612/614/616 is to find the largest blocks to be compressed out of the input stream, i.e., the largest contiguous match. This is accomplished by finding the largest output count from any entry. Because of the parallel compression, i.e., because a plurality of symbols are operated on in parallel, there could be multiple compressed blocks that need to be sent to the output. Because of this, in the 4 symbol parallel embodiment, two counts and three indices are provided to the output logic 618. These are referred to as the Previous Count and Index, the Max Count and Index, and the LZ12 index.

Selecting the largest count with a Mask of 11111 generates the Previous Count and Index. This indicates a compressed block that ended with the first data input of this cycle (i.e. the first data input or first symbol could not be compressed with this block). The Index is simply the entry number that contained the selected count. Selecting the largest count with a mask that is not 11111 generates the Max Count and Index. This indicates a compressed block that includes one or more of the 4 symbols received on this cycle. The mask from this entry is also forwarded to the output generator 618. The LZ12 index points to any block that returned a mask of 01111, which is the "special case". The special case includes a contiguous match of one or more middle symbols as described above. A combined compress mask block 616 generates a combined compress mask comprising a logical AND of all of the masks, and forwards this to the Output Generator 618.

Finally, the selected Max Mask and the Reset Value column in the table of FIG. 15 are used in generating a Reset Value. This reset value is distributed back to all entries, and the entries will reset their counters to the minimum of this value, or their present value.

Figure 16:
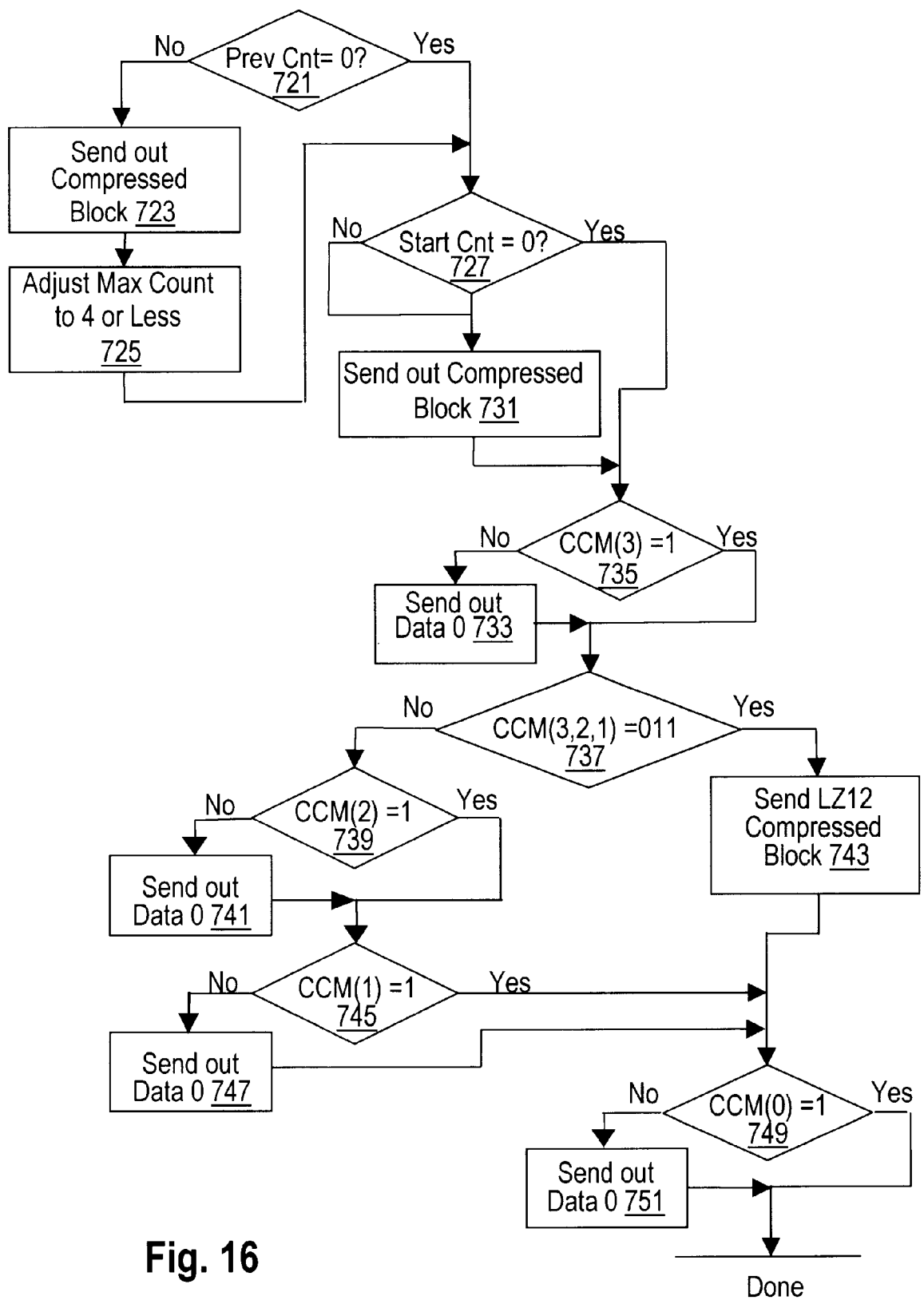
FIG. 16 illustrates the Output Generator Flow diagram.

FIG. 16—Output Stream Generator Flowchart

The output stream generator 618 logic (FIG. 14) generates the output stream according to the flowchart shown in FIG. 16. The term "CCM" in this flowchart refers to the Combined Compress Mask, and CCM(0) is the least significant bit as used in the table of FIG. 15. The output generator 618 sends out either uncompressed data, which includes the proper flags to indicate that it is not compressed, or a compressed block which includes a flag to indicate this is a compressed block along with an encoded count and index that is used by the decompression logic to regenerate the original input.

As shown, in step 721 the method determines if previous count equals zero. If no, then the method sends out the compressed block in step 723 and adjusts the max count to 4 or less in step 725. Operation then advances to step 727. If previous count is determined to equal zero in step 721, then operation proceeds directly to step 727.

In step 727 the method determines if Max Count equals zero, If not, then the method determines in step 729 if Max Mask equals 10000. If not, then the method sends out the compressed block in step 731. Operation then advances to step 735. If Max Cnt is determined to equal zero in step 727 or if Max Mask is determined to equal 10000 in step 729, then operation proceeds directly to step 735.

In step 735 the method determines if CCM (3) equals zero. if not, then the method sends out data zero in step 733. Operation then advances to step 737. If CCM (3) is determined to equal zero in step 735, then operation proceeds directly to step 737.

In step 737 the method determines if CCM (4,2,1) equals 011. If not, then in step 739 the method determines if CCM (2) equals 1. If not, then in step 741 the method sends out data zero, and operation proceeds to step 745. If CCM (2) is determined to equal 1 in step 739, then operation proceeds directly to step 745, In step 745 the method determines if CCM (1) equals 1. If not, then in step 747 the method sends out data zero. Operation then proceeds to step 749. If CCM (1) is determined to equal 1 in step 745, then operation proceeds directly to step 749.

If CCM (4,2,1) is determined to equal 011 in step 737, then in step 743, the method sends an LZ12 compressed block. Operation then proceeds to step 749.

In step 749 the method determines if CCM (0) equals 1. If not, then the method sends out data zero in step 751. Operation then completes. If CCM (0) is determined to equal 1 in step 749, then operation completes.

If single byte compression is being performed by this logic, i.e., if individual symbols are being compressed, additional indices for each of the byte matches should be generated by the Selection Logic to allow the Output Generator to compress these. Otherwise, the output generation logic should also handle the cases where outputs of a compressed stream result in a single byte non-compressed output and adjust the flags accordingly. Previous Data3 may also be required by the output generator 618 in the case that the previous match is a count of one. Preferably, one method of handling single byte matches would be to adjust the table of FIG. 15 to not allow generation of single byte compare masks because single byte compares normally force the compressed stream to increase in size. For example, in the 10xx rows, if the saved count is 0, count out should be 0 along with a mask of 11xx to prevent the generation of a compressed block for the D0 single byte match.

Figure 17:
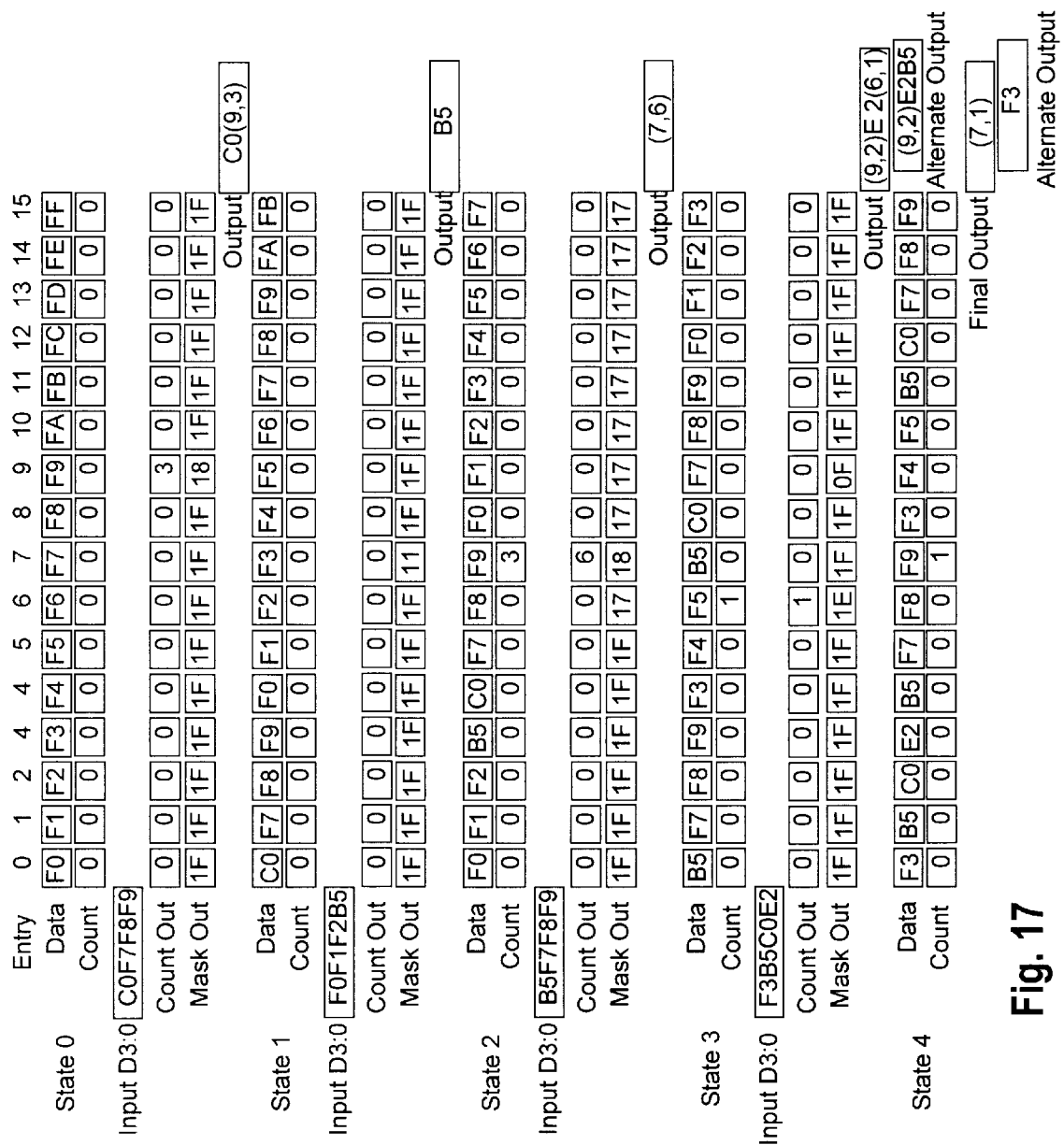
FIG. 17 illustrates an example of the parallel compression operation indicating the data flow through multiple cycles.

FIG. 17—Parallel Algorithm Example

FIG. 17 illustrates a parallel algorithm example. Assume a window (history table length) of 16 entries, that has been initialized to the following values: Entry 0=F0, Entry 1=F1 . . . Entry 15=FF. Also assume that all of the entry counters are 0. The below sequence shows state changes for the 4 indicated inputs.

In state 0, the input data, in the order received, is F0, F8, F7, C0. The input data is shown in the arrival order from right to left in FIG. 17, i.e., the input data D3:D0=C0,F7, F8,F9. In state 0, the input finds a match of the first 3 symbols in entry 9. This results in those three symbols being replaced in the output stream by compressed data indicating a count of 3 and an index of 9. The output mask value "18" prevents these uncompressed symbols from being included in the output stream, since the compressed data is being output to represent these symbols. Also in state 0, the symbol C5 is determined to not match any entry in the history table. Thus the symbol C5 is provided in the output steam in uncompressed form. Thus the output in state 0, from right to left, is: C0, (9,3).

In state 1, the input data, in the order received, is B5, F2, F1, F0. The symbol B5 does not match any entry in the history table. Thus the symbol B5 is provided in the output stream in uncompressed form. Also in state 1 three input symbols match 3 symbols in entry 7. Note that the matches are in previous entries, but the results calculation for this match occurs in entry 7. In other words, the actual matching entries are entries 6, 5, and 4. However, this match is detected by entry 7, since entry 7 compares the 4 input symbols with entries 7, 6, 5, and 4. Compressed data is not generated for this match in state 1 because the entry does not know if the match will continue with the next set of input symbols, and thus the output count is 0. The mask value for entry 7 prevents the matching data from being included in the output stream. Thus the output in state 1 is B5. The count value for entry 7 is updated to 3, as shown in state 2, to indicate the 3 matches in state 1.

In state 2, the input data, in the order received, is F9, F8, F7, B5, The matching in entry 7 continues for 3 more symbols, and then ends. Thus entry 7 outputs a count of 6 and a mask for the new matching symbols. In addition, entry 6 matches with the symbol B5. Thus entry 6 updates its count to 1 in state 3. However, since symbol B5 is the last symbol in this group of input symbols, the entry does not know if the match will continue with the next set of input symbols. Thus for entry 6 the output count is 0 and the mask value will prevent that symbol from being output. Thus the output in state 2 is (7,6)

In state 3, no further contiguous matches exist for the symbol B5 from state 2. Thus, for entry 6, the output count is 1 from entry 6 for the B5 input after stage 2, Also, no match is detected for input symbol E2, and thus E2 is output as an uncompressed symbol. In state 3 a match is detected with respect to the middle symbols C0 and B5. This match comprising solely middle symbols is detected by entry 9, and thus the 0F Mask is output from entry 9. This mask is the special case mask that indicates the two symbols centered in the input (B5C0 in this example) can be compressed out. The actual compressed output data or block will include a flag, a count of 2 and the index 9. Thus the output from state 3, from right to left, is (9,2), E2, (6,1), In an embodiment where individual symbols are not compressed, the output is (9,2), E2, B5, as shown in the alternate output box.

The final state in this example, state 4, has a 1 in the count for entry 7 as a result of a match of F3 with entry 4 in state 3. The mask from this match prevented the sending of the F3 to the output stream in state 3. If this were the end of the input stream, the window is flushed, resulting in the single symbol compression block for this match. The output would show a match of 1 at index 7. Thus, assuming that the input in state 3 is the final data received, then the final output for the stream is (7,1). Alternately, the single symbol match could be sent uncompressed as symbol F3, as shown in the alternate output box.

Compare Logic

The compare logic 612 and 614 (FIG. 14) in stage three, which is used to find the largest count may be specially designed to be able to complete in one cycle. The counts are especially critical because stage 2 must first choose to send 0, count, count+1, count+2 or count+3. The counts from all entries are then compared to find the largest.

Figure 18:
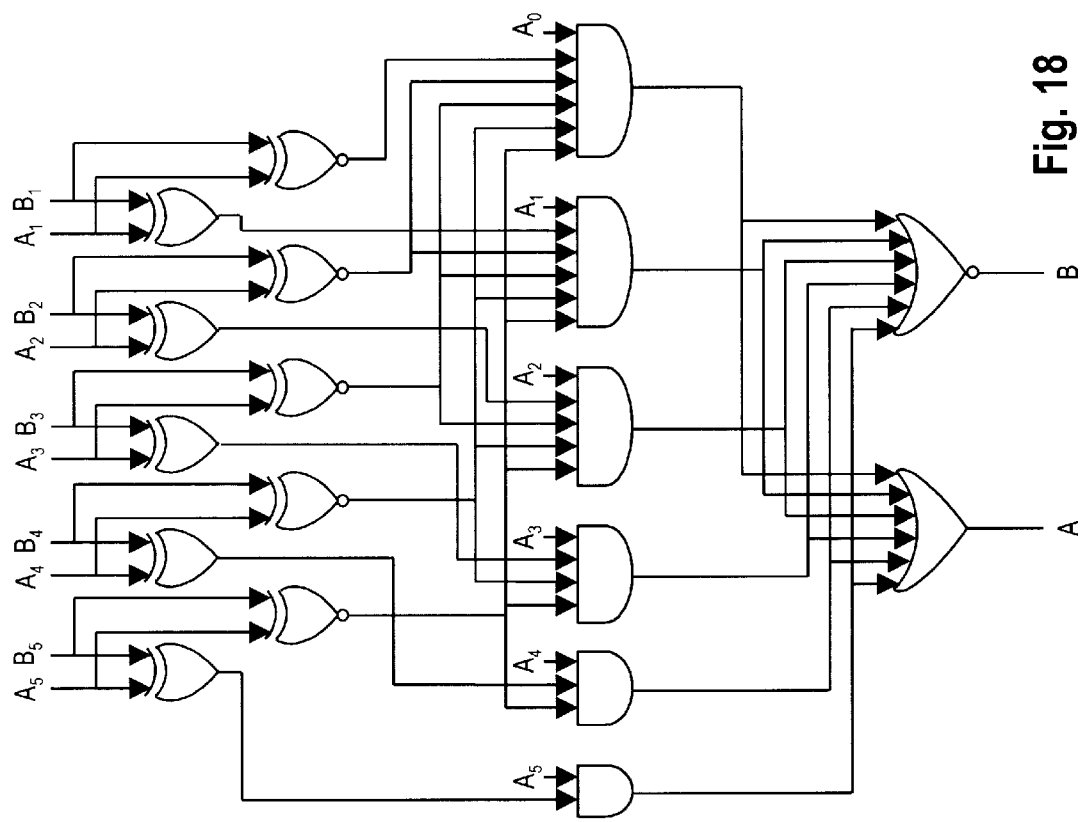
FIG. 18 illustrates a high speed parallel comparison circuit used to find the largest count of matching entries to the history table.

As shown in FIG. 18, straightforward greater-than compare of 2 multi-bit numbers requires 3 levels plus a selector. If the number is 6 bits, this compare will require around 30 gates, and the selector will require an additional 18 for the selector for 48 gates per 2-way compare. A stacked compare (64 to 32, 32 to 16, 16 to 8, 8 to 4, 4 to 2, 2 to 1) would require 6*5 levels of logic, and 48*63~3Kgates.

With standard 0.25 um process technology the time through the compare should be about 1.25nS (0.25ns per XOR, 0.5ns 6wayAnd/Or). The selector would take an additional 0.3nS for 1.55nS per compare. This stacked compare would then require 1.55nS*6=9.3nS. This doesn't include the selection and distribution of these counts from the source. For operation above 100Mhz clocking the timing is too limiting for proper operation.

Figure 19:
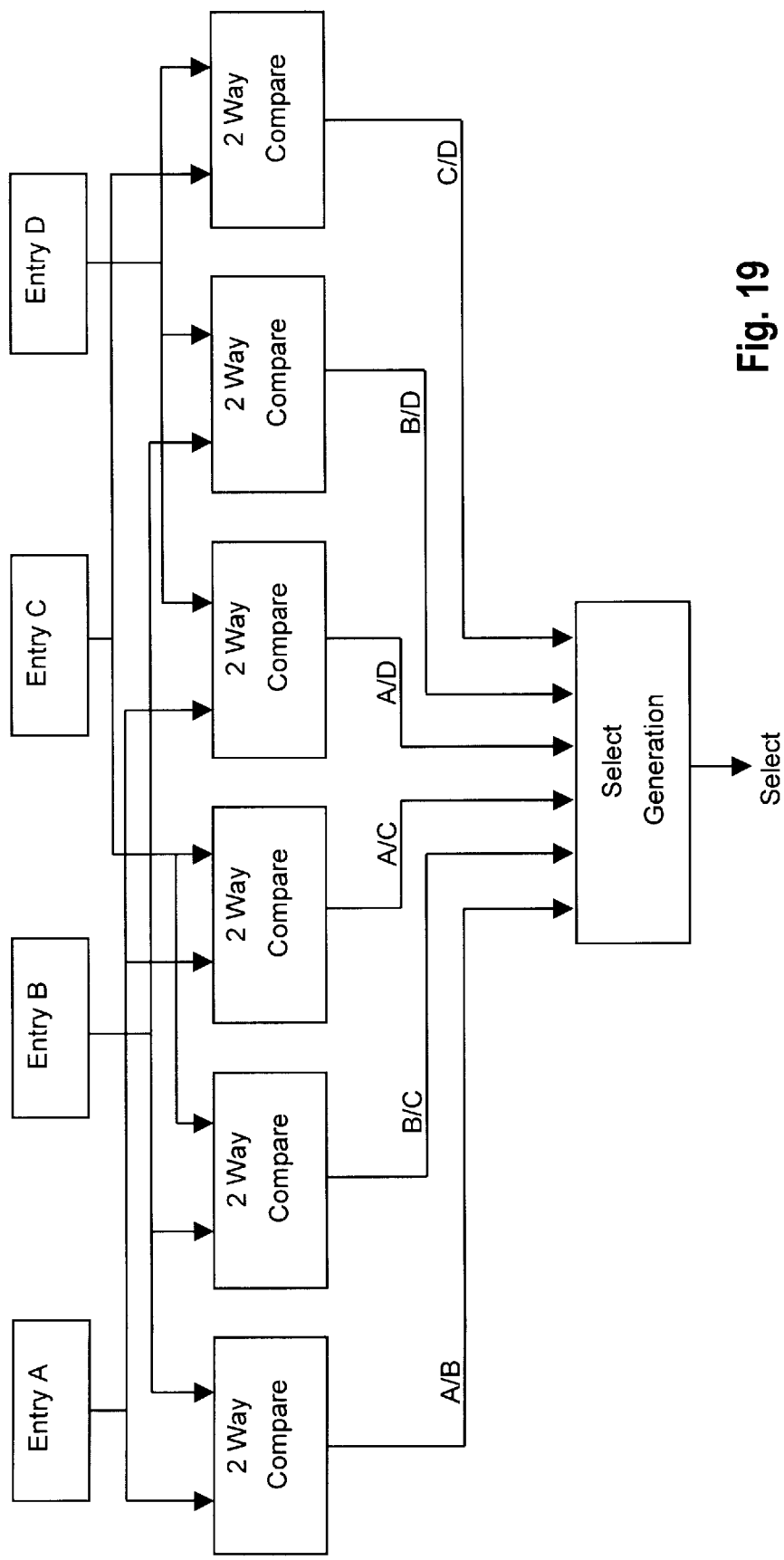
FIG. 19 further illustrates the select generation logic and entry compare logic designed for high data clocking rates.

In order to increase the speed, a novel 4 way parallel compare can be used, as shown in FIG. 19. This embodiment only requires 3 levels of compares (64 to 16, 16 to 4, 4 to 1), however, more two-way compares are required (6 per 4 way compare) and an additional And/Or is required before the selector. This design would then require 126 compares and 21 selectors for 126*30+21*33~4.5Kgates. But the resulting delay would be (1.55+0.3ns)*3Levels=5.55nS. This timing allows for high-speed parallel compression of the input data stream. The table of FIG. 20 describes the Select Generation Logic.

Loss Less Decompression

A discussion of the parallel decompression 280 for the lossless decompression of parallel compressed data is now disclosed. According to the present invention, decompression of the parallel compressed data can be done serially as well as in parallel. Because the data is designed to be identical to the serial compression algorithm, either serial or parallel decompression engines will result in the same data In the preferred embodiment, it is desirable to be able to decompress at least as fast as the compression operation or faster. Also, in alternate embodiments, decompression engines 280/555 may be placed in a plurality of locations within the system or circuit. Multiple decompression engines allow for a custom operation of the decompression process and a custom bandwidth of throughput may be designed depending on the number of stages used in the decompression engine. Therefore, below is a decompression algorithm for the decompression engine 280 that yields higher bandwidth than prior art serial algorithms.

Figure 22:
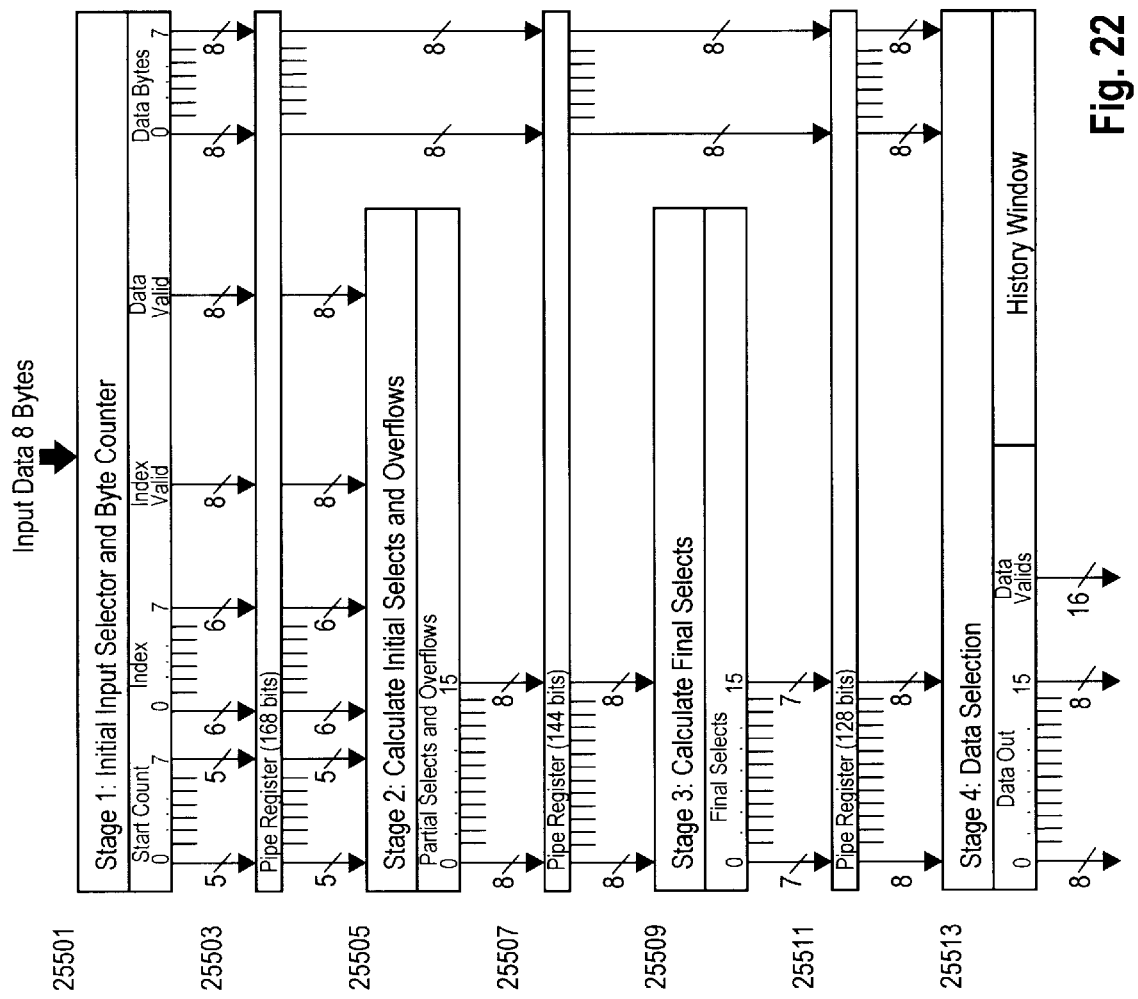
FIG. 22 illustrates the four stages used for the parallel lossless decompression algorithm.

According to the present invention the pipelined design is expected to require 4 stages to run at 100MHz using a $0.25\mu$ CMOS technology. The stages of the decompression engine are illustrated in FIG. 22. These stages are preferably divided up, or alternatively combined, as the silicon process technology requires. Only the last stage in this pipeline 25513 uses the history window, and that final stage contains minimum logic. Based on this, this function could be extended to many more than 4 stages if a significantly faster clock was available, Thus in alternate embodiments as process improves and clock rates increase the stages of the decompression engine can increase to increase the decompression rate with the same input compression stream. However, for the preferred embodiment the four stages shown are the logical divisions of the function. To understand this novel decompression the table of FIG. 21 illustrates the compression mask and index coding algorithm for a sample code. In alternate embodiment other codes could alter the design of the decompression unit.

With the preferred embodiment of codes is shown in the table of FIG. 21, the following decompression trees allows decoding of 8 bytes of the input in one cycle. The smallest encoded data is 8 bits, so the minimum number of decoders (25521–25535), indicated in FIG. 23, for 8 bytes is 8, Each of these decoders could see one of many data inputs depending on the prior compressed stream.

Figure 23:
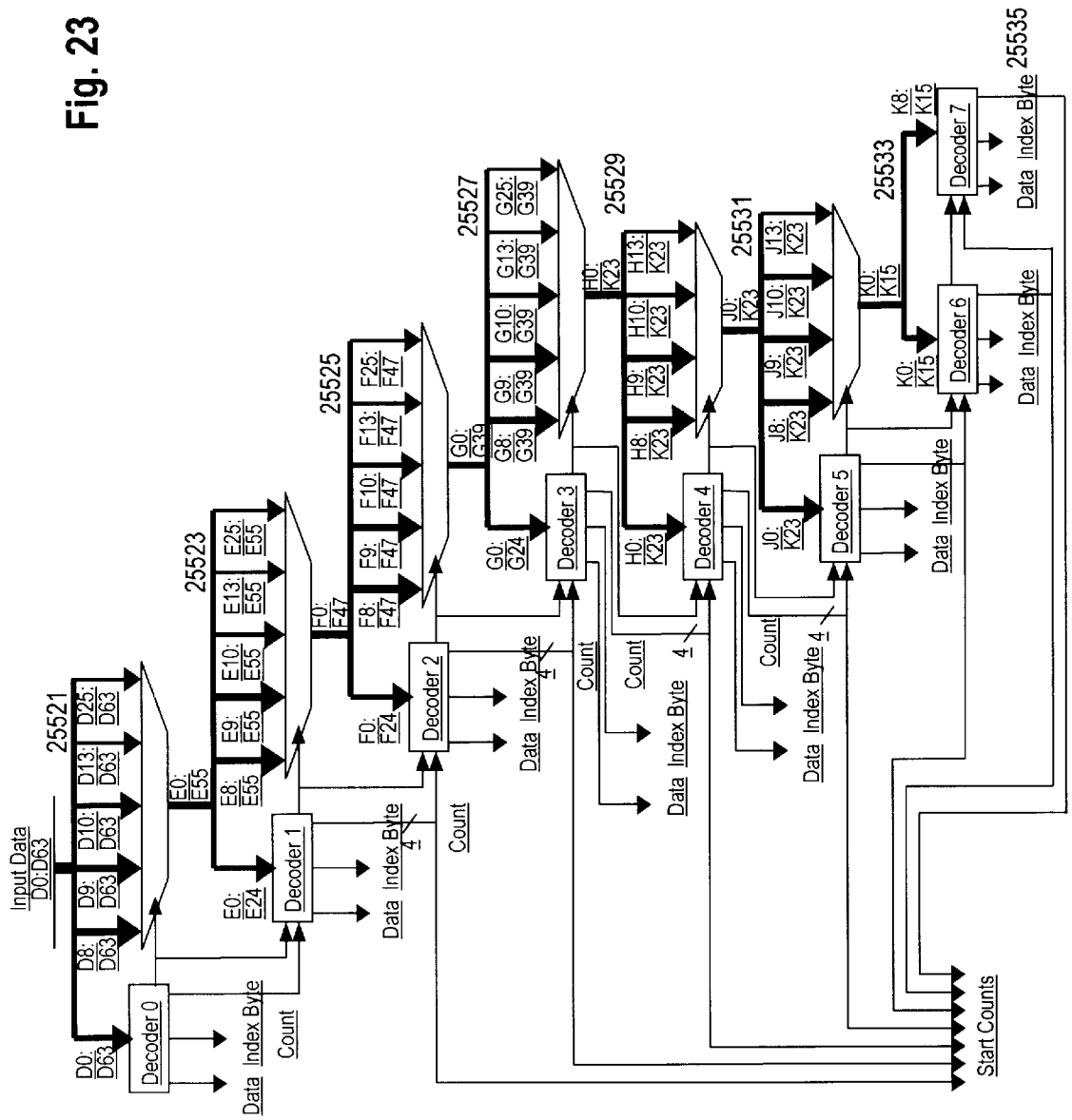
FIG. 23 illustrates the eight decoder stages required to generate the start counts used for the parallel decompression process according to one embodiment of the invention.

The decompression tree, shown in FIG. 23, requires very fast decoding at each stage to determine the proper data for the next stage. The Window Index, Start Count and Data Byte output (FIG. 21) should be latched for the next stage of the decode pipeline of FIG. 22. This decode pipeline requires the assembly of the output data. More detail of the preferred Decode block can be seen in FIG. 24.

Figure 24:
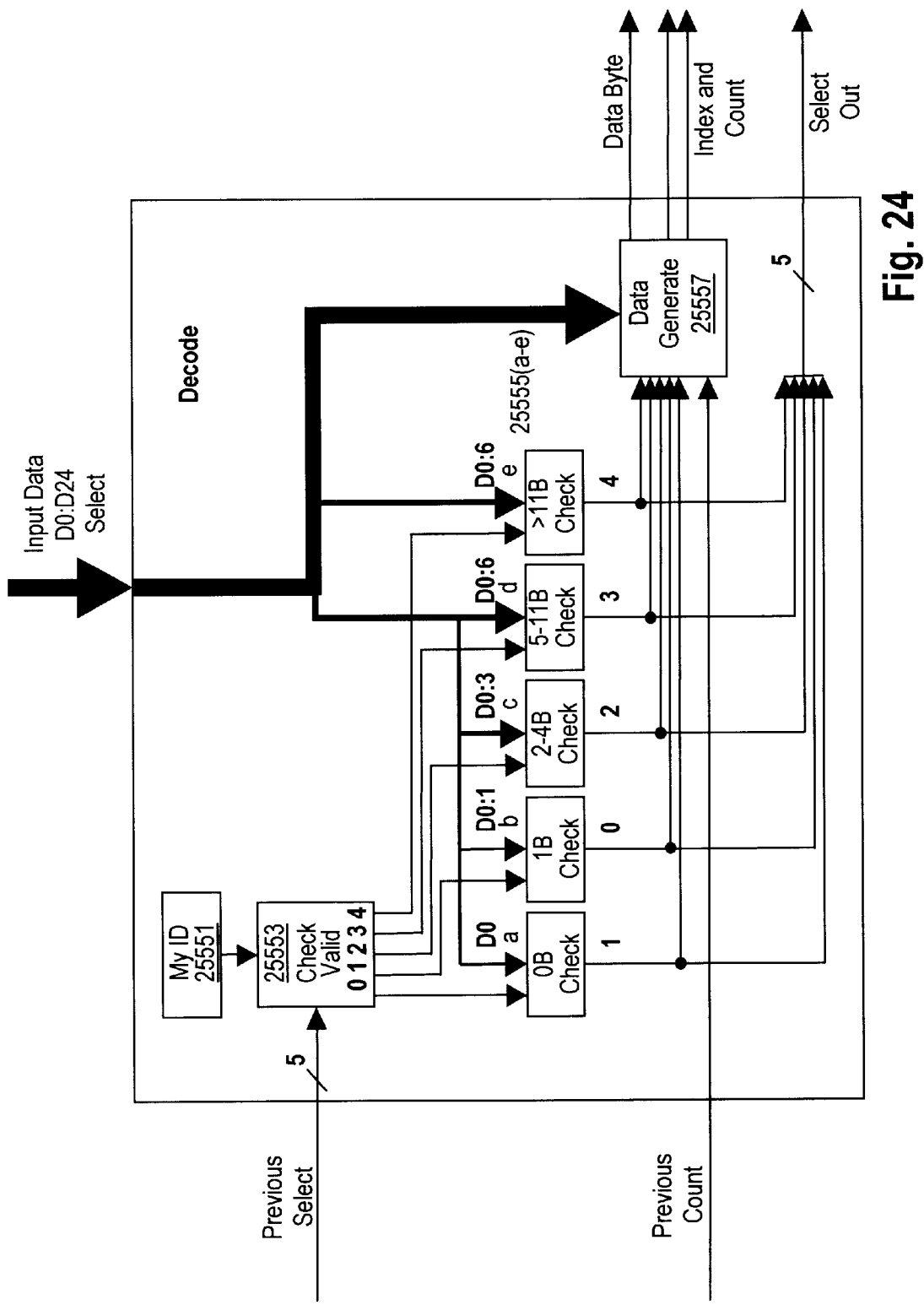
FIG. 24 illustrates a single decoder block used by the stage 1 input selector and byte counter of FIG. 22.

The Check Valid block 25553 verifies that enough bits are available for the checker 25555(*a–e*). The tables for these blocks are illustrated in the tables of FIGS. 25*a* and 25*b*. In the preferred embodiment, the longest path through Check Valid 25553 should be 3 gates, and the Byte Check 25555 (*a–c*) will only add one gate because the check is an output enable. The outputs from the Check Valid logic 25553, and the Byte Check logic 25555 in FIG. 24 show 0 as the most significant bit, and 6 as the least significant bit.

The data generate logic 25557 is simply a mux of the input data based on the check select 25555 input. At most, one Byte Check should be active for valid data. In addition an alternate embodiment may include a checker which is added to this decoder to verify that one byte check is active for valid data. The table of FIG. 25*b* describes the Data Generate outputs based on the Data Input and the Byte Check Select.

The second stage 22805 of the decompression begins calculating pointers to the appropriate bytes from the history window for compressed data which have been latched in the 168-bit pipe register 22803. Stage two receives eight copies of the Index & Count or Data Byte from each decoder, along with a pair of valid bits for these sets of signals, With minimal logic, a preliminary select can be calculated for each of the 16 output bytes that are latched in the 144-bit pipe register 22807. Each select latched into 32807 is a 7 bit encode (for a 64-entry window) with a single bit overflow. These signals are latched 32807 and used by the next unit 22809 in stage 3. The selects will have the values of 0–63 if a window value is to be used for this output byte, 64–71 if one of the eight data bytes is to be used for this output byte, and an overflow if the data for this output byte is a result of one of the other parallel decodes occurring with this data. The third stage 22809 checks each of the overflows from the previous stage 22805. If inactive, the 7 bit select is passed on unchanged. If active, the select from the correct stage 2 decoder 22805 is replicated on the select lines for this output byte.

The final stage of the decompression, stage 4 25513, selects the data from the window or the data bytes passed from the $1^{st}$ stage to build the output data. The output bytes that are assembled are then added to the window for the next cycles decode.

Because the maximum output of this design is 16 bytes per cycle, it is required that the $1^{st}$ stage select its next input data based on the number of bytes that will be used to decode 16 bytes. This is calculated during the $1^{st}$ stage in 22801. Additionally, the last stage 25513 includes data valid bits so that the proper output data assembly can occur if fewer than 16 bytes can be decoded for any one cycle. According to the preferred embodiment of present invention, the minimum number of bytes that could be decoded any cycle is 7 if there was no compression of the input data.

Decompression Timing

Each stage in this design has been timed to achieve 100MHz with 0.25 $\mu$ technology and low power standard cell design library Alternate embodiments may use custom data-paths or custom cells to achieve higher clock rates or fewer stages. Stage 1 22801 has proven to be the most critical at 9.1nS in standard cell design, Stage 2 22805, required only 3.8nS, with stages 3 22809 and 4 25513 at 8.23nS and 1.5n3 respectively. There will be some additional powering logic delay in stage 4 not accounted for in these calculations, which are not a problem due to the timing margin of stage 4 25513.

Scalable Compression/Decompression

The IMC 140 also includes scalable compression/decompression, wherein one or more of the parallel compression/decompression slices can be selectively applied for different data streams, depending on the desired priorities of the data streams.

Concurrency

The IMC 140 also allows concurrency of operations by allocation of multiple data requests from a plurality of requesting agents or from multiple data requests input from a single requesting agent. On average, when the compression and decompression unit 260/280 is used, the requested data block is retired sooner than without use of the current invention. When multiple data requests are queued from concurrent sources, the pending transactions can complete with less latency than in prior art systems. As the input block size grows and the number of pending concurrent data requests increase, the present invention becomes increasingly attractive for reduction of latency and increased effective bandwidth.

What is claimed is:

1. A method for managing solid state memory in a system including a solid state memory and a solid state memory controller coupled to the solid state memory, wherein the solid state memory controller includes a decompression engine, the method comprising:

storing compressed data on the solid state memory;

a device initiating a read of requested data from the solid state memory, wherein the requested data comprises compressed requested data stored on the solid state memory in a compressed format;

the solid state memory controller reading the compressed requested data from the solid state memory;

the solid state memory controller decompressing the compressed requested data to produce uncompressed requested data using parallel decompression, wherein said decompressing comprises:

examining a plurality of codes from the compressed requested data in parallel in a current decompression cycle, wherein each of the plurality of codes describes one or more symbols in the uncompressed requested data;

generating a plurality of selects in parallel in response to said examining the plurality of codes in parallel, wherein each of the plurality of selects points to a symbol in a combined history window; and generating the uncompressed requested data comprising the plurality of symbols using the plurality of selects; and the solid state memory controller providing the uncompressed requested data to the device.

2. The method of claim 1, further comprising:

storing the uncompressed plurality of symbols from the current decompression cycle in the combined history window.

3. The method of claim 2, wherein, in the current decompression cycle prior to said storing the uncompressed plurality of symbols, the combined history window includes an uncompressed plurality of symbols from any previous decompression cycles and zero or more data bytes from the current decompression cycle.

4. The method of claim 1, wherein said examining the plurality or codes includes generating, for each code, size and count information and at least one of a data byte or index information; and wherein said generating the plurality of selects in parallel uses the size and count information and at least one of the data byte or index information for each of the plurality of codes.

5. The method of claim 4, wherein a size for a code defines the number of bits comprising the code;

wherein a count for a code defines the number of symbols in the uncompressed data described by the code.

6. The method of claim 1, wherein the combined history window includes one or more data bytes from the current decompression cycle; and wherein one or more of the plurality of selects in the current decompression cycle point to one or more of the data bytes in the combined history window.

7. The method of claim 6, wherein said generating the plurality of selects in parallel uses index information generated for one or more of the plurality of codes to generate the one or more selects pointing to the one or more of the data bytes in the combined history window.

8. The method of claim 1, wherein the combined history window includes one or more uncompressed symbols from one or more previous decompression cycles; and wherein one or more of the plurality of selects in the current decompression cycle point to one or more of the uncompressed symbols in the combined history window from the one or more previous decompression cycles.

9. The method of claim 8, wherein said generating the plurality of selects in parallel uses index information generated for one or more of the plurality of codes to generate the one or more selects pointing to the one or more of the uncompressed symbols in the combined history window.

10. The method of claim 1, wherein the combined history window includes an uncompressed plurality of symbols from one or more previous decompression cycles and data bytes from the current decompression cycle, wherein said generating the plurality of selects in parallel comprises:

generating a first select to point to a data byte in the combined history window in response to a first code indicating that uncompressed data represented by the first code is the data byte; and generating a second select to point to a first symbol in the combined history window in response to a second code indicating that uncompressed data represented by the second code includes the first symbol in the combined history window.

11. The method of claim 10, wherein the uncompressed data represented by the second code includes one or more symbols following the first symbol in the combined history window, wherein selects are generated to point to each of the one or more symbols in the combined history window comprising the uncompressed data represented by the second code.

12. The method of claim 1, wherein the combined history window includes an uncompressed plurality of symbols from one or more previous decompression cycles and data bytes from the current decompression cycle, wherein said generating the plurality of selects in parallel comprises:

generating a first select to point to a first symbol being decompressed from a first code in the current decompression cycle, wherein the first select is generated in response to a second code indicating that uncompressed data represented by the second code includes the first symbol, and wherein the first symbol is not in the combined history window.

13. The method of claim 12, further comprising resolving the first select to point to one of a symbol in the current combined history window or a data byte in the current combined history window.

14. The method of claim 13, further comprising copying a second select being generated for the first code to the first select, wherein the second select points to one of a symbol in the combined history window or a data byte in the combined history window.

15. The method of claim 1, wherein the combined history window includes an uncompressed plurality of symbols from one or more previous decompression cycles, wherein storing the uncompressed plurality of symbols from the current decompression cycle in the combined history window includes removing from the combined history window at least a portion of the uncompressed plurality of symbols from the one or more previous decompression cycles.

16. The method of claim 1, wherein said examining the plurality of codes in parallel comprises:

extracting a portion of the compressed data as an input data, wherein the input data includes the plurality of codes;

extracting one or more codes from the input data; and generating, for each code, size and count information and at least one of a data byte or index information.

17. The method or claim 16, wherein a plurality of decoders are operable to examine the plurality of codes in parallel in the current decompression cycle, wherein said extracting the one or more codes comprises:

a) determining a next decoder in the plurality of decoders;

b) extracting a code from the input data to be a current code in response to determining the next decoder;

c) determining the number of uncompressed symbols to be generated by the current code; and d) assigning the current code to the net decoder.

18. The method of claim 16, wherein said extracting the one or more codes further comprises determining a size of each of the one or more codes.

19. The method of claim 16, wherein said extracting the one or more codes further comprises:

determining if a code in the input data is a complete code or an incomplete code, wherein the code is extracted from the input data to be the current code in response to determining the code is a complete code.

20. The method of claim 1, wherein said receiving the compressed data, said examining a plurality of codes, said generating a plurality of selects, and said generating the uncompressed data comprising the plurality of symbols are performed substantially concurrently in a pipelined fashion.

21. The method of claim 1, further comprising:

the solid state memory controller reading a header for the compressed requested data from the solid state memory prior to said decompressing the compressed requested data;

wherein the header includes information used in said decompressing the compressed requested data.

22. The method of claim 1, wherein the solid state memory controller further includes a compression engine, the method further comprising:

a device initiating a write of uncompressed data to the solid state memory, wherein the uncompressed data is in an uncompressed format;

the solid state memory controller receiving the uncompressed data from the device;

the solid state memory controller compressing the uncompressed data to produce compressed data, wherein the uncompressed data comprises a plurality of symbols, wherein said compressing comprises:

a) comparing a plurality of symbols from the uncompressed data with each entry in a history table in a parallel fashion, wherein said comparing produces compare results;

wherein the history table comprises entries, wherein each entry comprises at least one symbol, and wherein the method maintains a current count of prior matches which occurred when previous symbols were compared with entries in the history table;

b) determining match information for each of said plurality of symbols based on the current count and the compare results; and c) outputting compressed data in response to the match information; and the solid state memory controller storing the compressed data on the solid state memory.

23. The method of claim 22, wherein said outputting compressed data includes:

outputting a count value and an entry pointer for a contiguous match, wherein the entry pointer points to the entry in the history table which produced the contiguous match, wherein the count value indicates a number of matching symbols in the contiguous match.

24. The method of claim 23, wherein said outputting the count value includes encoding a value representing the count value; wherein more often occurring counts are encoded with fewer bits than less often occurring counts.

25. The method of claim 22, wherein said outputting compressed data further includes:

for non-matching symbols which do not match any entry in the history table, outputting the non-matching symbols.

26. The method of claim 22, further comprising:

d) repeating steps a)–c) one or more times until no more data is available; and e) when no more data is available, if the current count is non-zero, outputting compressed data for the remaining match in the history table.

27. The method of claim 26, wherein said determining match information includes determining zero or more matches of said plurality of symbols with each entry in the history table.

28. The method of claim 22, wherein the method further maintains a count flag for each entry in the history table;

wherein said determining determines match information for each of said plurality of symbols based on the current count, the count flags, and the compare results.

29. The method of claim 28, wherein said determining match information includes:

resetting the count and count flags if the compare results indicate a contiguous match did not match one of the plurality of symbols.

30. The method of claim 28, wherein the count and count flags for all entries are reset based on the number of the plurality of symbols that did not match in the contiguous match.

31. The method of claim 22, wherein said determining match information includes:

updating the current count according to the compare results.

32. The method of claim 22, wherein said determining match information includes:

determining a contiguous match based on the current count and the compare results;

determining if the contiguous match has stopped matching;

if the contiguous match has stopped matching, then:

updating the current count according to the compare results; and wherein said outputting compressed data includes outputting compressed data corresponding to the contiguous match.

33. The method of claim 32, wherein said outputting compressed data corresponding to the contiguous match comprises outputting a count value and an entry pointer, wherein the entry pointer points to the entry in the history table which produced the contiguous match, wherein the count value indicates a number of matching symbols in the contiguous match.

34. The method of claim 22, wherein the plurality of symbols includes a first symbol, a last symbol, and one or more middle symbols;

wherein said determining match information includes:

if at least one contiguous match occurs with one or more respective contiguous middle symbols, and the one or more respective contiguous middle symbols are not involved in a match with either the symbol before or after the respective contiguous middle symbols, then:

selecting the one or more largest non-overlapping contiguous matches involving the middle symbols;

wherein said outputting compressed data includes outputting compressed data for each of the selected matches involving the middle symbols.

35. The method of claim 22, wherein the method further maintains a count flag for each entry in the history table;

wherein said determining determines match information for each of said plurality of symbols based on the current count, the count flags, and the compare results;

wherein said determining match information and said outputting compressed data in response to the match information comprises:

determining zero or more matches of said plurality of symbols with each entry in the history table;

examining the compare results for each entry;

for non-matching symbols which do not match any entry in the history table, outputting the non-matching symbols;

if any entry stopped matching, examining the current count, the count flags, and the compare results for every entry;

determining the contiguous match based on the current count and the compare results;

determining if the contiguous match has stopped matching;

if the contiguous match has stopped matching, then:

outputting a count value and an entry pointer, wherein the entry pointer points to the entry in the history table which produced the contiguous match, wherein the count value indicates a number of matching symbols in the contiguous match; and updating the current count according to the compare results; the method further comprising:

e) repeating steps a)–c) one or more times until no more data is available; and f) when no more data is available, if the current count is non-zero, outputting a count value and an entry pointer for the remaining match in the history table.

36. The method of claim 35, wherein the plurality of symbols includes a first symbol, a last symbol, and one or more middle symbols;

wherein, if the contiguous match has stopped matching, then the method further comprises:

if at least one contiguous match occurs with one or more respective contiguous middle symbols, and the one or more respective contiguous middle symbols are not involved in a match with either the symbol before or after the respective contiguous middle symbols, then:

selecting the largest non-overlapping contiguous matches involving the middle symbols;

outputting a count value and an entry pointer for each of the selected matches involving the middle symbols.

37. The method of claim 22, wherein the plurality of symbols comprise a power of 2 number of symbols.

38. The method of claim 22, wherein the plurality of symbols comprise four symbols.

39. The method of claim 22, further comprising:

generating a header for the compressed data; and storing the header on the solid state memory;

wherein the header includes information for decompressing the compressed data.

* * * * *

UNITED STATES PATENT AND TRADEMARK OFFICE

CERTIFICATE OF CORRECTION

PATENT NO.: 6,145,069

DATED: November 7, 2000

INVENTOR(S): Thomas A. Dye

It is certified that error appears in the above-identified patent and that said Letters Patent is hereby corrected as shown below:

Claim 17, col. 31, line 19, please delete "net" and substitute --next--.

Signed and Sealed this

First Day of May, 2001

Attest:

NICHOLAS P. GODICI

*Attesting Officer*     *Acting Director of the United States Patent and Trademark Office*